US012748152B2

(12) United States Patent
Miyake et al.

(10) Patent No.: US 12,748,152 B2
(45) Date of Patent: Sep. 29, 2026

(54) VOLTAGE MEASUREMENT DEVICE AND CELL STACK SYSTEM

(71) Applicant: Nuvoton Technology Corporation Japan, Kyoto (JP)

(72) Inventors: Jiro Miyake, Osaka (JP); Naohisa Hatani, Kyoto (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 245 days.

(21) Appl. No.: 18/456,299

(22) Filed: Aug. 25, 2023

(65) Prior Publication Data

US 2023/0408586 A1 Dec. 21, 2023

Related U.S. Application Data

(63) Continuation of application No. PCT/JP2022/009389, filed on Mar. 4, 2022.

(Continued)

(51) Int. Cl.

*H02J 7/90* (2026.01)
*G01R 19/00* (2006.01)

(Continued)

(52) U.S. Cl.

CPC .......... *H02J 7/933* (2026.01); *G01R 19/0084* (2013.01); *G01R 31/371* (2019.01);

(Continued)

(58) Field of Classification Search

CPC .. H02J 7/00712; H02J 7/00032; H02J 7/0013; H02J 7/0019; H02J 7/0047;

(Continued)

(56) References Cited

U.S. PATENT DOCUMENTS 6,020,717 A 2/2000 Kadouchi et al.
9,627,896 B2 4/2017 Nishihara (Continued)

FOREIGN PATENT DOCUMENTS

CN 107234971 A 10/2017
CN 207311148 U 5/2018

(Continued)

OTHER PUBLICATIONS

International Search Report dated May 10, 2022 issued in International Patent Application No. PCT/JP2022/009387, with English translation.

(Continued)

*Primary Examiner* — Daniel R Miller
(74) *Attorney, Agent, or Firm* — Rimon P.C.

(57) ABSTRACT

A voltage measurement device measures the voltage of at least one of series-connected battery cells, and includes one or more voltage detection circuits. Each voltage detection circuit includes: a first communication path; a mode control circuit that switches a mode of operation of the voltage detection circuit between normal and low-power modes; a first communication control circuit (communication control circuit) that transmits and receives a command signal to and from the first communication path; an activation signal detection circuit that detects an activation signal input from the first communication path; and an alarm generation circuit that, in the low-power mode, generates and outputs an alarm signal indicating an anomaly in the battery cells to the first communication path. In the low-power mode, when the activation signal detection circuit detects the activation signal, the mode control circuit switches the mode of operation to the normal mode.

18 Claims, 17 Drawing Sheets

Related U.S. Application Data

(60) Provisional application No. 63/244,598, filed on Sep. 15, 2021, provisional application No. 63/157,251, filed on Mar. 5, 2021.

(51) Int. Cl.

| | |
|---|---|
| ***G01R 31/371*** | (2019.01) |
| ***G01R 31/3835*** | (2019.01) |
| ***G01R 31/396*** | (2019.01) |
| ***H01M 10/42*** | (2006.01) |
| ***H01M 10/48*** | (2006.01) |
| ***H01M 50/51*** | (2021.01) |
| ***H02J 7/40*** | (2026.01) |
| ***H02J 7/50*** | (2026.01) |
| ***H02J 7/56*** | (2026.01) |
| ***H02J 7/80*** | (2026.01) |

(52) U.S. Cl.
CPC ....... *G01R 31/3835* (2019.01); *G01R 31/396* (2019.01); *H01M 10/425* (2013.01); *H01M 10/482* (2013.01); *H01M 50/51* (2021.01); *H02J 7/40* (2026.01); *H02J 7/50* (2026.01); *H02J 7/56* (2026.01); *H02J 7/80* (2026.01); *H01M 2010/4271* (2013.01); *H01M 2010/4278* (2013.01); *H02J 2207/20* (2020.01)

(58) Field of Classification Search
CPC .. H02J 2207/20; H02J 2310/48; H02J 7/1423; G01R 19/0084; G01R 31/371; G01R 31/3835; G01R 31/396; G01R 31/392; H01M 10/425; H01M 10/482; H01M 50/51; H01M 2010/4271; H01M 2010/4278; H01M 10/42; H01M 10/48; Y02E 60/10
See application file for complete search history.

(56) References Cited

U.S. PATENT DOCUMENTS

| | | | | |
|---|---|---|---|---|
| 2008/0278115 | A1 | 11/2008 | Huggins | |
| 2009/0295398 | A1 | 12/2009 | Ohnuki | |
| 2010/0271223 | A1 | 10/2010 | Ohkura et al. | |
| 2010/0301868 | A1 | 12/2010 | Ishikawa et al. | |
| 2012/0025769 | A1* | 2/2012 | Kikuchi .................. | B60L 58/14 320/118 |
| 2012/0182024 | A1 | 7/2012 | Ike et al. | |
| 2012/0306506 | A1 | 12/2012 | Kiuchi | |
| 2015/0054467 | A1 | 2/2015 | Takano et al. | |
| 2015/0069974 | A1 | 3/2015 | Okada et al. | |
| 2015/0303728 | A1 | 10/2015 | Miura et al. | |
| 2017/0010329 | A1* | 1/2017 | Tang ........................ | H04Q 9/00 |
| 2017/0012444 | A1 | 1/2017 | Kamei | |
| 2018/0017631 | A1 | 1/2018 | Kudo et al. | |
| 2019/0221893 | A1 | 7/2019 | Marsili et al. | |
| 2021/0159710 | A1 | 5/2021 | Furukawa et al. | |
| 2021/0313815 | A1 | 10/2021 | Kobayashi | |

FOREIGN PATENT DOCUMENTS

| | | | |
|---|---|---|---|
| CN | 211223102 | U | 8/2020 |
| CN | 111942216 | A | 11/2020 |
| JP | 08-140204 | A | 5/1996 |
| JP | 2011-185941 | A | 9/2011 |
| JP | 2012-154641 | A | 8/2012 |
| JP | 2013-219936 | A | 10/2013 |
| JP | 2015-055503 | A | 3/2015 |
| JP | 2015-141062 | A | 8/2015 |
| JP | 2016-025794 | A | 2/2016 |
| JP | 2018-194336 | A | 12/2018 |
| JP | 2021-018070 | A | 2/2021 |
| KR | 10-2019-0010003 | A | 1/2019 |
| WO | 2016/132895 | A1 | 8/2016 |
| WO | 2020/129577 | A1 | 6/2020 |

OTHER PUBLICATIONS

International Search Report dated Apr. 26, 2022 issued in International Patent Application No. PCT/JP2022/009389, with English translation.

International Search Report dated May 10, 2022 issued in International Patent Application No. PCT/JP2022/009390, with English translation.

International Search Report dated Apr. 26, 2022 issued in International Patent Application No. PCT/JP2022/009391, with English translation.

International Search Report dated Oct. 25, 2022 issued in International Patent Application No. PCT/JP2022/034446, with English translation.

Extended European Search Report dated Aug. 21, 2024 issued in the corresponding European Patent Application No. 22763424.3.

Extended European Search Report dated Aug. 21, 2024 issued in the corresponding European Patent Application No. 22763425.0.

Extended European Search Report dated Aug. 12, 2024 issued in the corresponding European Patent Application No. 22763426.8.

Non-Final Office Action dated Nov. 10, 2025 issued in related U.S. Appl. No. 18/456,273.

Notice of Allowance dated May 14, 2026 issued for the U.S. Appl. No. 18/456,273.

Office Action issued in corresponding U.S. Appl. No. 18/457,113, dated Jun. 23, 2026.

* cited by examiner

VOLTAGE MEASUREMENT DEVICE AND CELL STACK SYSTEM

CROSS REFERENCE TO RELATED APPLICATIONS

This is a continuation application of PCT International Application No. PCT/JP2022/009389 filed on Mar. 4, 2022, designating the United States of America, which is based on and claims priority of U.S. Provisional Patent Application No. 63/157,251 filed on Mar. 5, 2021, and U.S. Provisional Patent Application No. 63/244,598 filed on Sep. 15, 2021. The entire disclosures of the above-identified applications, including the specifications, drawings, and claims are incorporated herein by reference in their entirety.

FIELD

The present disclosure relates to voltage measurement devices and cell stack systems.

BACKGROUND

A conventional cell stack system including a plurality of battery cells connected in series and a voltage measurement device that measures the voltage of the plurality of battery cells is known (see, for example, Patent Literature (PTL) 1).

The voltage measurement device includes a plurality of voltage detection circuits that measure battery cell voltage and a control circuit that controls the plurality of voltage detection circuits. The plurality of voltage detection circuits are daisy-chained together.

When such a cell stack system is used in, for example, an in-vehicle power supply, it is necessary to monitor the cell stack with a voltage detection circuit because anomalies can occur even when the vehicle equipped with the cell stack system is stopped (i.e., even when the batteries are not charged by regenerative energy). For this reason, there are known techniques to operate the voltage measurement device in a low-power mode to achieve long-term monitoring without having to recharge the battery.

In the low-power mode, the power consumption of the communication circuit in the voltage detection circuit is also restricted, so it may not be possible to transmit or receive usual command signals (i.e., communication commands). Therefore, in order to quickly and reliably notify the control circuit of a battery cell anomaly detected by the voltage detection circuit even in the low-power mode, it is possible to employ a technique of providing, in addition to the daisy communication path, a communication path for the voltage detection circuit to output an alarm signal to the control circuit to notify the control circuit of the battery cell anomaly.

CITATION

Patent Literature

PTL 1: Japanese Unexamined Patent Application Publication No. 2021-18070

SUMMARY

Technical Problem

Here, each voltage detection circuit is supplied with power from a high-voltage power supply. The control circuit, on the other hand, is supplied with power from a low-voltage power supply. It is therefore necessary to isolate each voltage detection circuit from the control circuit. The communication path between a voltage detection circuit and the control circuit requires an intervening isolation element, such as a photocoupler, for example. These communication paths thus increase the circuit size. The inclusion of the intervening isolation elements also increases the cost of the cell stack system.

The present disclosure overcomes such problems and has an object to provide a voltage measurement device and the like that can inhibit an increase in circuit size and can output an alarm signal even in the low-power mode.

Solution to Problem

In order to overcome the above-described problems, a voltage measurement device according to one aspect of the present disclosure measures a voltage of at least one battery cell among a plurality of battery cells connected in series, and includes one or more voltage detection circuits. Each of the one or more voltage detection circuits includes: a first communication path; a mode control circuit that switches a mode of operation of the voltage detection circuit between a normal mode and a low-power mode that consumes less power than the normal mode; a first communication control circuit that transmits and receives a command signal to and from the first communication path; an activation signal detection circuit that detects an activation signal input from the first communication path; and an alarm generation circuit that, in the low-power mode, generates and outputs an alarm signal indicating an anomaly in the plurality of battery cells to the first communication path. In the low-power mode, when the activation signal detection circuit detects the activation signal, the mode control circuit switches the mode of operation to the normal mode.

In order to overcome the above-described problems, a cell stack system according to one aspect of the present disclosure includes the above-described voltage measurement device and a cell stack including the plurality of battery cells.

Advantageous Effects

According to the present disclosure, a voltage measurement device and the like that can inhibit an increase in circuit size and can output an alarm signal even in the low-power mode can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, embodiments of the present disclosure will be described with reference to the drawings. Each of the following embodiments shows a specific example of the present disclosure. The numerical values, shapes, materials, elements, the arrangement and connection of the elements, etc., indicated in the following embodiments are mere examples, and therefore do not intend to limit the present disclosure.

The figures are schematic illustrations and are not necessarily precise depictions. Accordingly, the figures are not necessarily to scale. Elements that are essentially the same share like reference signs in the figures, and duplicate description is omitted or simplified.

Embodiment 1

The voltage measurement device and the cell stack system according to Embodiment 1 will be described.

1-1. Overall Configuration

Figure 1:
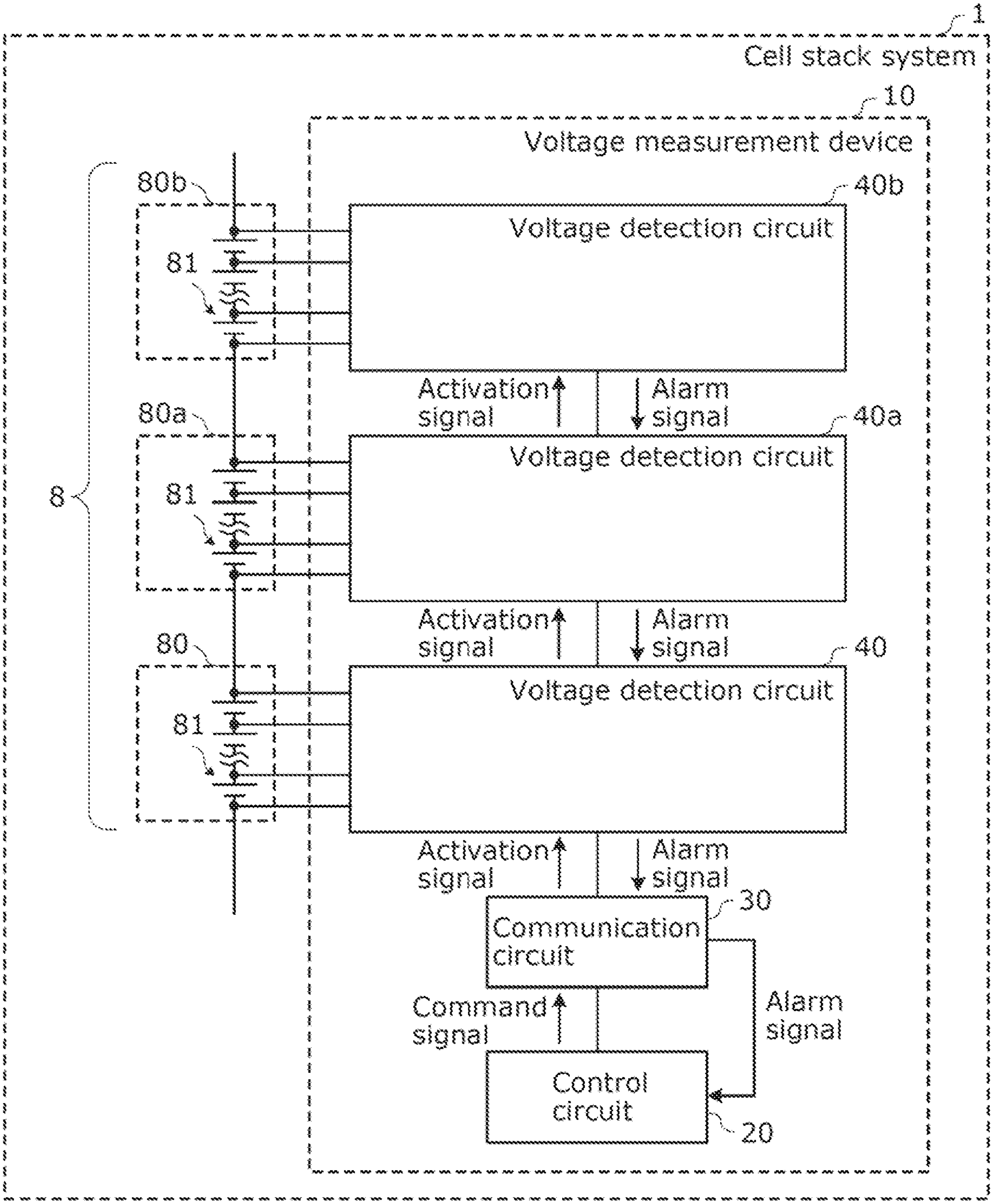
FIG. 1 is a block diagram illustrating the overall configuration of a cell stack system according to Embodiment 1.

The overall configuration of the cell stack system including the voltage measurement device according to the present embodiment will be described with reference to FIG. 1. FIG. 1 is a block diagram illustrating the overall configuration of cell stack system 1 according to the present embodiment.

Cell stack system 1 is a system that supplies DC power. As illustrated in FIG. 1, cell stack system 1 includes voltage measurement device 10 and cell stack 8.

Cell stack 8 includes a plurality of battery modules 80, 80*a*, and 80*b* connected in series. Each of battery modules 80, 80*a*, and 80*b* includes a plurality of battery cells 81 connected in series. However, the configuration of battery cell 81 is not limited to this example. For example, a lithium-ion battery can be used as battery cell 81.

Voltage measurement device 10 is a device that measures the voltage of at least one battery cell 81 among the plurality of battery cells 81 connected in series. In the present embodiment, voltage measurement device 10 measures the voltage of each of the plurality of battery cells 81. Voltage measurement device includes voltage detection circuits 40, 40*a*, and 40*b*. In the present embodiment, voltage measurement device 10 further includes communication circuit 30 and control circuit 20. Voltage detection circuits 40, 40*a*, and 40*b* are daisy-chained together. Voltage measurement device 10 includes two modes of operation: a normal mode and a low-power mode. In the low-power mode, since the power consumption by voltage detection circuit 40, etc., is limited, the voltage detection operation can be performed for extended periods of time without having to charge the plurality of battery cells 81.

Figure 2:
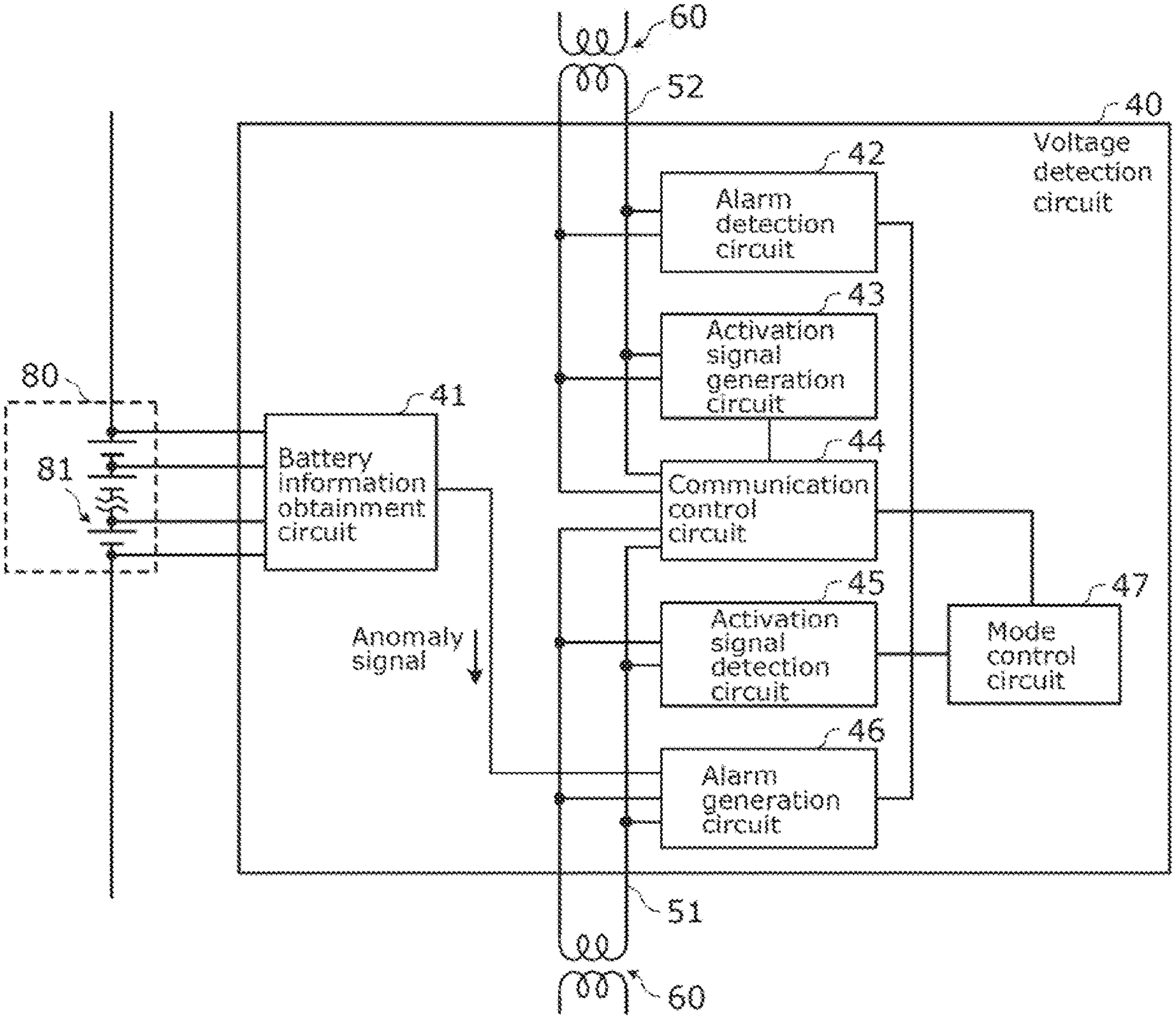
FIG. 2 is a block diagram illustrating the configuration of a voltage detection circuit according to Embodiment 1.

Each of voltage detection circuits 40, 40*a*, and 40*b* is a circuit that detects the voltage of the plurality of battery cells 81. Voltage detection circuit 40 is one example of a first voltage detection circuit located at one end of the daisy-chained voltage detection circuits 40, 40*a*, and 40*b*, and is connected to communication circuit 30. Hereinafter, the configuration of voltage detection circuit 40 will be described with reference to FIG. 2 as a representative of voltage detection circuits 40, 40*a*, and 40*b*. Voltage detection circuits 40*a* and 40*b* have the same configuration as voltage detection circuit 40. FIG. 2 is a block diagram illustrating the configuration of voltage detection circuit according to the present embodiment.

As illustrated in FIG. 2, voltage detection circuit 40 includes battery information obtainment circuit 41, communication control circuit 44, activation signal detection circuit 45, alarm generation circuit 46, mode control circuit 47, and first communication path 51. In the present embodiment, voltage detection circuit 40 further includes alarm detection circuit 42, activation signal generation circuit 43, and second communication path 52.

First communication path 51 is one of the two communication paths that make up the daisy communication path of voltage detection circuit 40. First communication path 51 of voltage detection circuit 40 is connected to communication circuit 30 via isolation element 60. In the present embodiment, isolation element 60 is a transformer. Isolation element 60 is not limited to any specific element so long as the element can transmit signals while maintaining electrical isolation. Isolation element 60 may be, for example, a capacitor, a photocoupler, etc.

Second communication path 52 is a different communication path than first communication path 51. Second communication path 52 is the other of the two communication paths that make up the daisy communication path of voltage detection circuit 40. Second communication path 52 of voltage detection circuit 40 is connected to first communication path 51 of voltage detection circuit 40*a*. Second communication path 52 of voltage detection circuit 40*a* is connected to first communication path 51 of voltage detection circuit 40*b*. Stated differently, second communication path 52 of one of two voltage detection circuits that are adjacently connected among the plurality of daisy-chained voltage detection circuits is connected to first communication path 51 of the other of the two voltage detection circuits.

Second communication path 52 of one of two voltage detection circuits that are adjacently connected among the plurality of daisy-chained voltage detection circuits is connected to first communication path 51 of the other of the two voltage detection circuits via isolation element 60.

Battery information obtainment circuit 41 is a circuit that detects the voltage of at least one battery cell 81 among the plurality of battery cells 81. In the present embodiment, battery information obtainment circuit 41 detects the voltage of each of the plurality of battery cells 81. Battery information obtainment circuit 41 may obtain information other than the voltage of the plurality of battery cells 81. For example, battery information obtainment circuit 41 may obtain the current flowing in the plurality of battery cells 81, the temperature of the plurality of battery cells 81, etc. When battery information obtainment circuit 41 detects that at least one of the plurality of battery cells 81 is anomalous, it outputs anomaly information to alarm generation circuit 46. For example, battery information obtainment circuit 41 detects the voltage value of battery cell 81 connected to voltage detection circuit 40, and compares the voltage value with a preset threshold value to determine whether the voltage value is anomalous or not. If the voltage value is anomalous, anomaly information corresponding to the anomaly is output to alarm generation circuit 46. Battery information obtainment circuit 41 includes, for example, an analog-to-digital converter (ADC), converts analog measurement values into digital signals, and outputs the digital signals.

Alarm detection circuit 42 is one example of a first alarm detection circuit that detects an alarm signal input from second communication path 52. The alarm signal is used in the low-power mode to notify the user of an anomaly in battery cell 81. When alarm detection circuit 42 detects an alarm signal, it outputs an alarm detection signal to alarm generation circuit 46.

In the low-power mode, alarm generation circuit 46 is a circuit that generates and outputs an alarm signal indicating an anomaly in battery cell 81 to first communication path 51. Alarm generation circuit 46 generates an alarm signal based on the anomaly information from battery information obtainment circuit 41. In the present embodiment, alarm generation circuit 46 outputs an alarm signal to first communication path 51 when alarm detection circuit 42 detects an alarm signal in addition to the anomaly information from battery information obtainment circuit 41. More specifically, when alarm detection circuit 42 detects an alarm signal, it outputs an alarm detection signal to alarm generation circuit 46. Alarm generation circuit 46 outputs an alarm signal to first communication path 51 when an alarm detection signal is input to alarm generation circuit 46.

Communication control circuit 44 is one example of a first communication control circuit that transmits and receives a command signal to and from first communication path 51. In the present embodiment, a command signal is transmitted and received from first communication path 51 and second communication path 52. Communication control circuit 44 controls voltage detection circuit 40 based on the received command signal. For example, when communication control circuit 44 receives an activation command signal from first communication path 51, it causes activation signal generation circuit 43 to output an activation signal to second communication path 52. In the normal mode, when communication control circuit 44 receives a mode change command signal, it causes mode control circuit 47 to switch the mode of operation to the low-power mode.

Activation signal generation circuit 43 is one example of a first activation signal generation circuit that generates and outputs an activation signal to second communication path 52. The activation signal is a signal used to activate voltage detection circuit 40, etc., in the low-power mode. When communication control circuit 44 receives an activation command signal from first communication path 51, activation signal generation circuit 43 outputs an activation signal to second communication path 52.

Activation signal detection circuit 45 is a circuit that detects an activation signal input from first communication path 51. When activation signal detection circuit 45 detects an activation signal, it outputs an activation request signal to mode control circuit 47.

Mode control circuit 47 is a circuit that switches the mode of operation of voltage detection circuit 40 between the normal mode and the low-power mode that consumes less power than the normal mode. In the low-power mode, when activation signal detection circuit 45 detects an activation signal, mode control circuit 47 switches the mode of operation to the normal mode. More specifically, in the low-power mode, when activation signal detection circuit 45 detects an activation signal, activation signal detection circuit 45 outputs an activation request signal to mode control circuit 47. When an activation request signal is input to mode control circuit 47, mode control circuit 47 switches the mode of operation to the normal mode.

Figure 3:
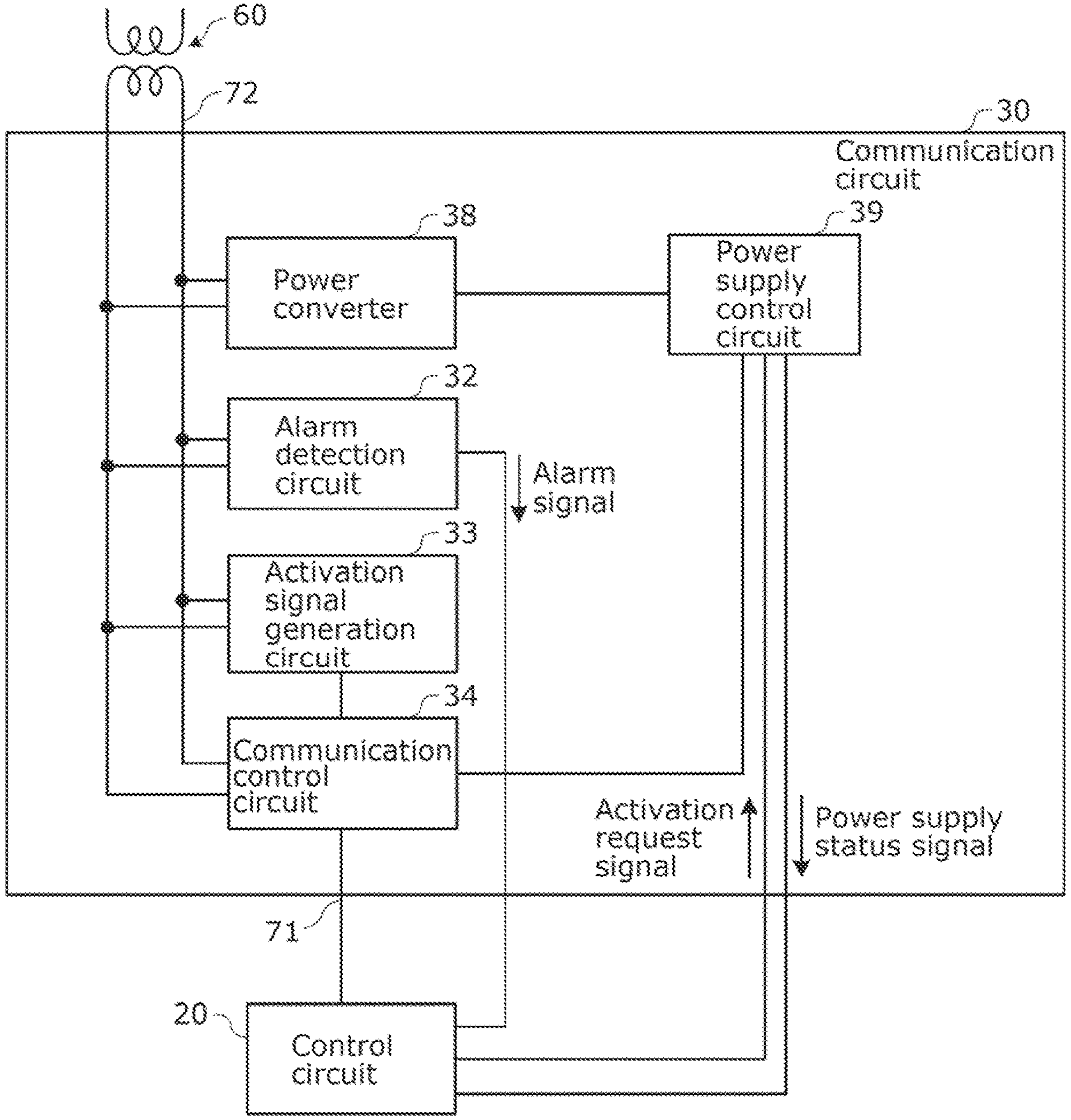
FIG. 3 is a block diagram illustrating the configuration of a communication circuit according to Embodiment 1.

Communication circuit 30 is a circuit that communicates with control circuit 20 and voltage detection circuits 40, 40*a*, and 40*b*. Communication circuit 30 is connected to first communication path 51 of voltage detection circuit 40. In the present embodiment, communication circuit 30 is connected to first communication path 51 of voltage detection circuit 40, which is located at one end of the daisy-chained voltage detection circuits 40, 40*a*, and 40*b*. Hereinafter, communication circuit 30 according to the present embodiment will be described with reference to FIG. 3. FIG. 3 is a block diagram illustrating the configuration of communication circuit 30 according to the present embodiment. FIG. 3 also illustrates control circuit 20. As illustrated in FIG. 3, in the present embodiment, communication circuit 30 includes first communication path 71, second communication path 72, alarm detection circuit 32, activation signal generation circuit 33, communication control circuit 34, power converter 38, and power supply control circuit 39.

First communication path 71 is a communication path that is connected to control circuit 20. Communication circuit 30 transmits and receives a command signal to and from control circuit 20 via first communication path 71. Since both communication circuit 30 and control circuit 20 operate using power from a low-voltage power supply, isolation element 60 need not be interposed between first communication path 71 and control circuit 20.

Second communication path 72 is a communication path that is connected to first communication path 51 of voltage detection circuit 40. Second communication path 72 is connected to first communication path 51 via isolation element 60.

Alarm detection circuit 32 is one example of a second alarm detection circuit that detects an alarm signal. An alarm signal output from voltage detection circuit 40 is input to alarm detection circuit 32 via first communication path 51 and second communication path 72. When alarm detection circuit 32 detects an alarm signal, alarm detection circuit 32 notifies control circuit of the detection of the alarm signal. In the present embodiment, alarm detection circuit 32 outputs an alarm signal to control circuit 20.

Activation signal generation circuit 33 is one example of a second activation signal generation circuit that generates an activation signal. When activation signal generation circuit 33 receives an activation command from control circuit 20, activation signal generation circuit 33 outputs an activation signal to first communication path 51 of voltage detection circuit 40. When an alarm signal is input from alarm detection circuit 32 or when it is desired to switch to the normal mode, such as when the vehicle in which cell stack system 1 is installed is finished stopping, control circuit 20 transmits an activation command signal to communication control circuit 34. Communication control circuit 34 that receives the activation command signal causes activation signal generation circuit 33 to output an activation signal.

Communication control circuit 34 is one example of a second communication control circuit that transmits and receives a command signal to and from first communication path 71 and second communication path 72.

Power converter 38 is a device that converts a signal input to second communication path 72 into DC voltage. In the present embodiment, power converter 38 converts the alarm signal to DC voltage. Instead of power converter 38, power may be supplied from outside communication circuit 30 in low-power mode.

Power supply control circuit 39 is a circuit that controls the supply of power from a power supply (not illustrated in the drawings) to communication circuit 30. Power supply control circuit 39 limits the supply of power from the power supply in the low-power mode and does not limit the supply of power from the power supply in the normal mode. Power supply control circuit 39 may transmit a power supply status signal to control circuit 20 indicating the status of the power supply. Power supply control circuit 39 may start the supply of power from the power supply to communication circuit 30 upon receiving an activation request signal from control circuit 20 when the supply of power from the power supply to communication circuit 30 is interrupted.

Control circuit 20 is a circuit that controls voltage detection circuits 40, 40*a*, and 40*b*. In the present embodiment, control circuit 20 is connected to communication circuit 30. Control circuit 20 controls voltage detection circuits 40, 40*a* and 40*b* via communication circuit 30 by transmitting a command signal to communication circuit 30. Control circuit 20 transmits an activation command signal to first communication path 71 of communication circuit 30 when an alarm signal is input from alarm detection circuit 32 of communication circuit 30. Control circuit 20 can be realized using, for example, a micro-controller unit (MCU).

1-2. Operations

Operations performed by voltage measurement device 10 according to the present embodiment will be described.

As described above, voltage measurement device 10 includes two modes of operation: a normal mode and a low-power mode. Hereinafter, the operation of switching from the normal mode to the low-power mode in voltage measurement device 10 will be described.

First, in the normal mode, control circuit 20 transmits a mode change command signal to communication circuit 30. Upon receiving the mode change command signal, communication control circuit 34 of communication circuit 30 transmits the mode change command signal to first communication path 51 of voltage detection circuit 40. After transmitting the mode change command signal, communication control circuit 34 switches the mode of operation of communication circuit 30 to the low-power mode.

Upon receiving the mode change command signal, communication control circuit 44 of voltage detection circuit 40 transmits the mode change command signal to voltage detection circuit 40*a*. After transmitting the mode change command signal, communication control circuit 44 switches the mode of operation of mode control circuit 47 to the low-power mode. This switches the mode of operation of voltage detection circuit 40 to the low-power mode. Similarly, the modes of operation of voltage detection circuits 40*a* and 40*b* are also switched to the low-power mode.

As described above, the mode of operation of voltage measurement device 10 can be switched from the normal mode to the low-power mode. In the low-power mode, for example, each voltage detection circuit reduces power consumption by extending the time interval of voltage detection of battery cell 81 to a time interval longer than the time interval in the normal mode, or by limiting the operation of communication functions or the like.

Next, operations performed by voltage measurement device 10 in the low-power mode will be described. Operations performed when the mode of operation is switched from the low-power mode to the normal mode will be described.

When switching the mode of operation from the low-power mode to the normal mode, an activation command signal is first transmitted from control circuit 20 to communication control circuit 34 of communication circuit 30. Upon receiving the activation command signal, communication control circuit 34 causes activation signal generation circuit 33 to output an activation signal. The activation signal is input to first communication path 51 of voltage detection circuit 40 via second communication path 72. Communication control circuit 34 transmits the activation command signal to first communication path 51 of voltage detection circuit 40 via second communication path 72.

Next, the activation signal will be described. In the low-power mode, the operation of communication functions is limited, whereby communication control circuit 44 and the like cannot receive command signals. Stated differently, in the low-power mode, voltage detection circuit 40, etc., cannot recognize the contents of a command signal even if they receive a command signal. Therefore, even in the low-power mode, a signal with a waveform that can be received by voltage detection circuit 40, etc., is used as the activation signal and the like. More specifically, the activation signal is a signal with a waveform whose interval (or period) between level changes is sufficiently large compared to the command signal. This allows activation signals to be detected even when the signal detection cycle is set longer in activation signal detection circuit 45, etc., to reduce power consumption. Alarm signals, etc., used in low-power mode are also signals with a waveform whose interval between level changes is sufficiently large compared to command signal, just like the activation signals.

Such an activation signal is detected by activation signal detection circuit 45. When activation signal detection circuit 45 detects an activation signal, activation signal detection circuit 45 causes mode control circuit 47 to switch the mode of operation to the normal mode.

After switching to the normal mode, communication control circuit 44 receives the activation command signal from first communication path 51. Upon receiving the activation command signal, communication control circuit 44 causes activation signal generation circuit 43 to output an activation signal.

In this way, the mode of operation of voltage detection circuit 40 is switched from the low-power mode to the normal mode. Voltage detection circuit 40 inputs the activation signal and transmits the activation command signal to first communication path 51 of voltage detection circuit 40*a*. This switches the mode of operation of voltage detection circuit 40*a* to the normal mode, just as with voltage detection circuit 40. Thereafter, similarly, the mode of operation of voltage detection circuit 40*b* is switched to the normal mode.

As described above, the overall mode of operation of voltage measurement device 10 is switched from the low-power mode to the normal mode.

Next, operations performed by voltage measurement device 10 when there is an anomaly in battery cell 81, etc., in the low-power mode will be described.

As described above, even in the low-power mode, each voltage detection circuit intermittently monitors battery cell 81, including detecting the voltage of battery cell 81. For example, when battery information obtainment circuit 41 of voltage detection circuit 40*a* detects an anomaly in battery cell 81, etc., battery information obtainment circuit 41 outputs anomaly information indicating an anomaly in battery cell 81, etc., to alarm generation circuit 46.

Upon receipt of the anomaly information, alarm generation circuit 46 generates an alarm signal corresponding to the anomaly information and inputs the alarm signal from first communication path 51 of voltage detection circuit 40*a* to second communication path 52 of voltage detection circuit 40. When an alarm signal is input to second communication path 52 of voltage detection circuit 40, alarm detection circuit 42 detects the alarm signal and outputs an alarm detection signal to alarm generation circuit 46. When an alarm detection signal is input to alarm generation circuit 46, alarm generation circuit 46 outputs an alarm signal from first communication path 51 to second communication path 72 of communication circuit 30.

When an alarm signal is input to second communication path 72, alarm detection circuit 32 of communication circuit 30 detects the alarm signal and outputs the alarm signal to control circuit 20. When the alarm signal is input to control circuit 20, control circuit 20 transmits an activation command signal to communication control circuit 34 of communication circuit 30. Thereafter, just like the operation of switching the mode of operation from the low-power mode to the normal mode, the mode of operation of each voltage detection circuit is switched to the normal mode. This places voltage measurement device 10 in a state where it can take action against an anomaly, such as interrupting the connection between battery cell 81 and the load, for example.

As described above, voltage measurement device 10 according to the present embodiment can output an alarm signal from voltage detection circuit 40 to communication circuit 30 using the daisy communication path of voltage detection circuits 40, 40*a* and 40*b*, even in the low-power mode. The circuit size can be inhibited from increasing in the present embodiment since no communication path other than the daisy communication path is required. Accordingly, the cost of voltage measurement device 10 and cell stack system 1 can be kept down.

In communication circuit 30 described above, the supply of power from the power supply is limited in the low-power mode, but the supply of power from the power supply may be interrupted by power supply control circuit 39. In such cases, in the normal mode, upon receiving the mode change command signal, communication control circuit 34 of communication circuit 30 causes power supply control circuit 39 to interrupt supply of power from the power supply after transmitting the mode change command signal.

However, in the low-power mode, when an alarm signal is input to communication circuit 30 from second communication path 72, power converter 38 converts the alarm signal into DC voltage. Power converter 38 outputs the DC voltage to power supply control circuit 39. Power supply control circuit 39 causes the power supply to start supplying power when the DC voltage is input.

Next, power supply control circuit 39 outputs a power supply status signal to control circuit 20 indicating the status of the power supply that has started supplying power. Based on the power supply status signal, control circuit 20 detects that an alarm signal has been input to communication circuit 30, and performs necessary processing such as switching the mode of operation of each voltage detection circuit to the normal mode.

In order for control circuit 20 to activate communication circuit 30 when the power supply to communication circuit 30 from the power source is interrupted, an activation request signal is output to power supply control circuit 39 of communication circuit 30. Power supply control circuit 39 causes the power supply to start supplying power to communication circuit 30 when the activation request signal is input.

As described above, in the low-power mode, the supply of power from the power supply to communication circuit 30 may be interrupted. This further reduces the power consumption of voltage measurement device 10 in the low-power mode.

Embodiment 2

The voltage measurement device and the cell stack system according to Embodiment 2 will be described. The voltage measurement device according to the present embodiment differs from voltage measurement device 10 according to Embodiment 1 mainly in that measures are taken against collisions between activation signals and alarm signals. Hereinafter, the voltage measurement device and the cell stack system according to the present embodiment will be described, focusing on the differences from voltage measurement device 10 and cell stack system 1 according to Embodiment 1.

2-1. Overall Configuration

Figure 4:
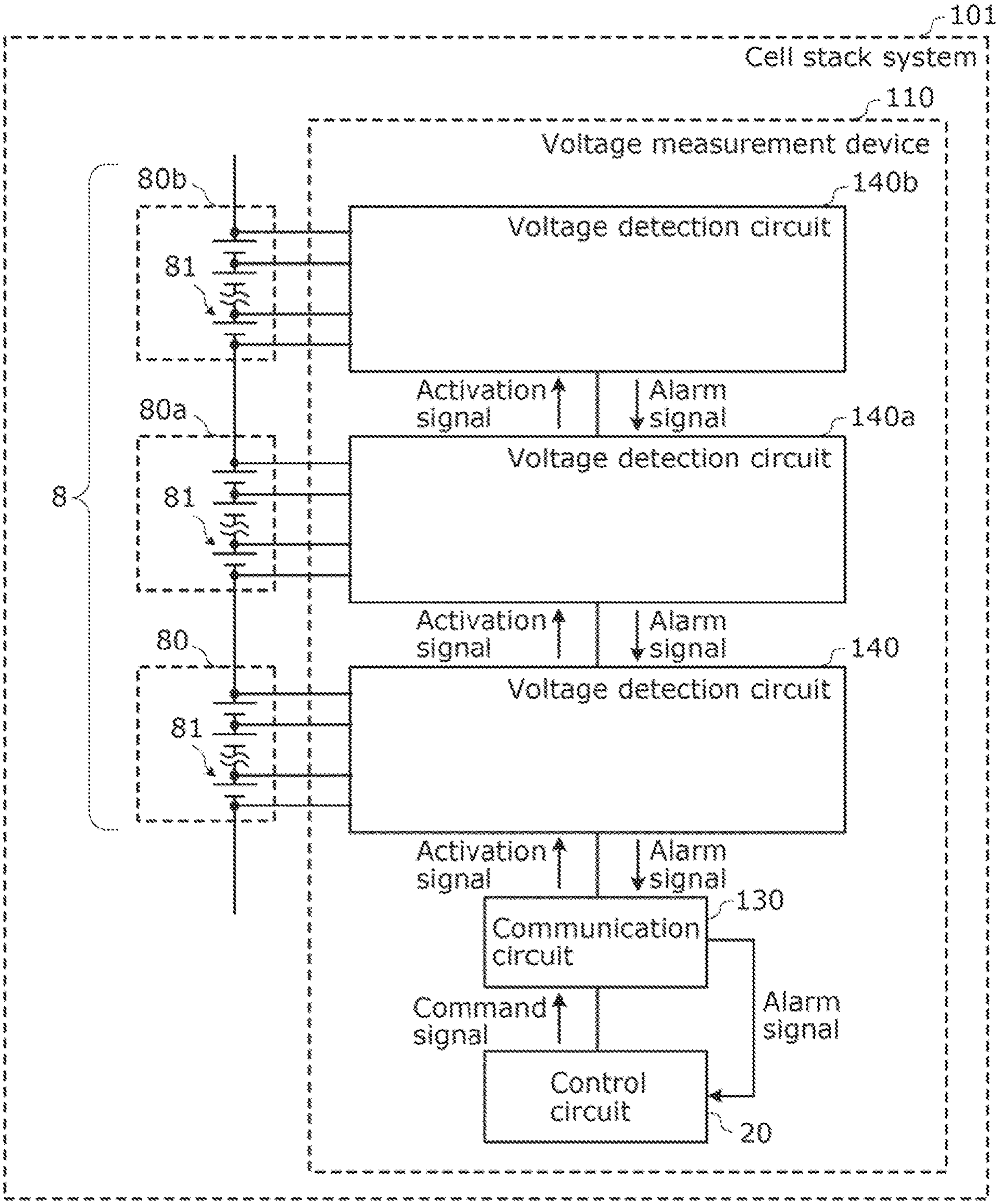
FIG. 4 is a block diagram illustrating the overall configuration of a cell stack system according to Embodiment 2.

The overall configuration of the cell stack system including the voltage measurement device according to the present embodiment will be described with reference to FIG. 4. FIG. 4 is a block diagram illustrating the overall configuration of cell stack system 101 according to the present embodiment. As illustrated in FIG. 4, cell stack system 101 includes voltage measurement device 110 and cell stack 8. Voltage measurement device 110 includes voltage detection circuits 140, 140*a*, and 140*b*, communication circuit 130, and control circuit 20.

Figure 5:
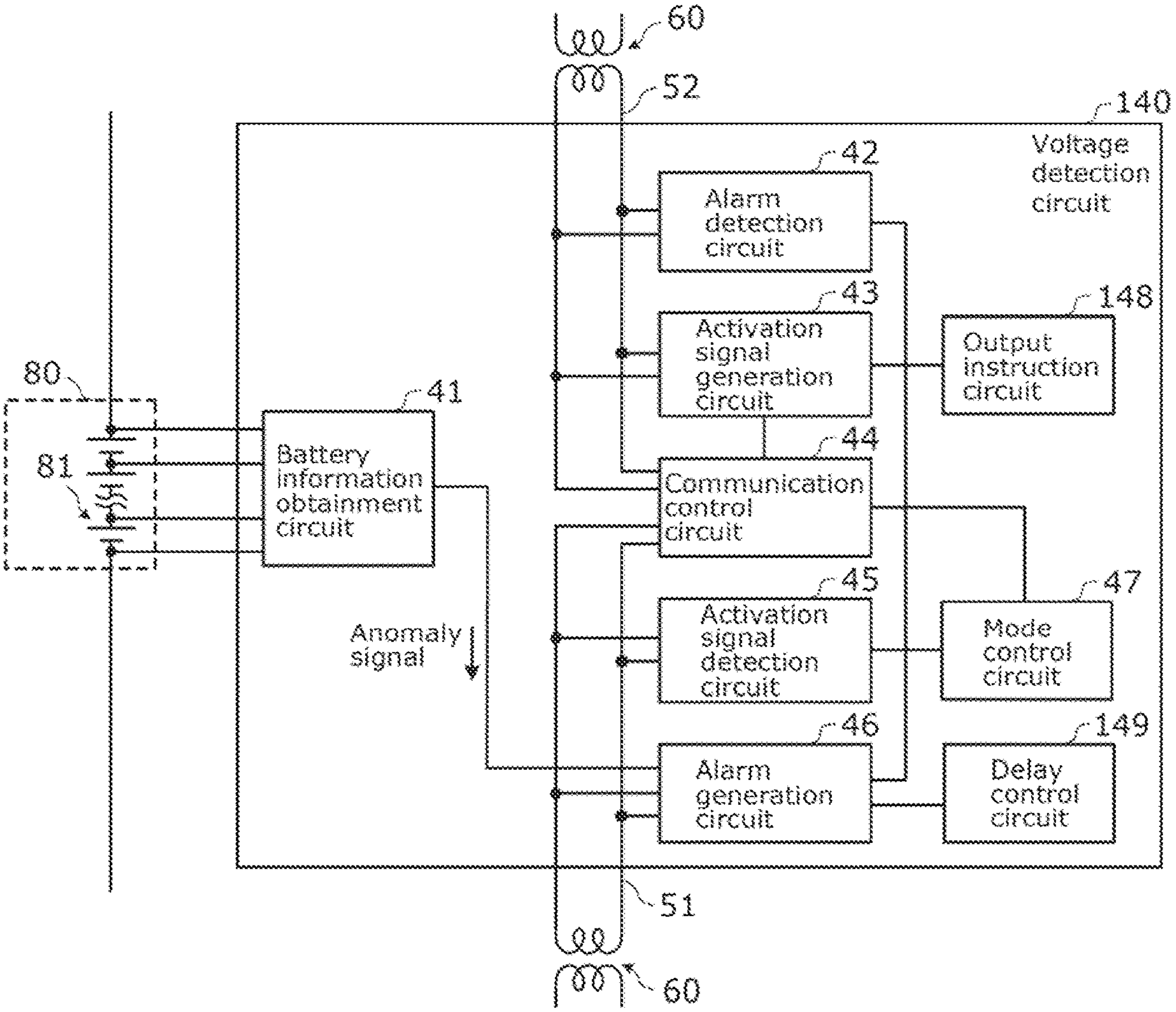
FIG. 5 is a block diagram illustrating the configuration of a voltage detection circuit according to Embodiment 2.

Hereinafter, the configuration of voltage detection circuit 140 will be described with reference to FIG. 5 as a representative of voltage detection circuits 140, 140*a*, and 140*b*. Voltage detection circuits 140*a* and 140*b* have the same configuration as voltage detection circuit 140. FIG. 5 is a block diagram illustrating the configuration of voltage detection circuit 140 according to the present embodiment.

As illustrated in FIG. 5, voltage detection circuit 140 includes battery information obtainment circuit 41, communication control circuit 44, activation signal detection circuit 45, alarm generation circuit 46, mode control circuit 47, alarm detection circuit 42, activation signal generation circuit 43, output instruction circuit 148, delay control circuit 149, first communication path 51, and second communication path 52.

Output instruction circuit 148 is one example of a first output instruction circuit that causes activation signal generation circuit 43 to output the activation signal a plurality of times at a first time interval. Here, the first time interval is the time from the end of the output of one activation signal to the start of the output of the next activation signal. For example, the first time interval is longer than the output period of the alarm signal. For example, output instruction circuit 148 detects that activation signal generation circuit 43 has output the activation signal a first time and clocks the first time interval, using a timer, from the end of the first output of the activation signal. Next, after the first time interval has elapsed from the end of the first output of the activation signal, output instruction circuit 148 causes activation signal generation circuit 43 to output the activation signal a second time. Output instruction circuit 148 may cause activation signal generation circuit 43 to output the activation signal yet again.

Delay control circuit 149 causes alarm generation circuit 46 to output two consecutive alarm signals at a second time interval. Here, the second time interval is the time from the end of the output of one alarm signal to the start of the output of the next alarm signal. For example, the second time interval is longer than the sum of the first time interval and two output periods of the activation signal. For example, delay control circuit 149 detects that alarm generation circuit 46 has output the first alarm signal and clocks the second time interval, using a timer, from the end of the output of the first alarm signal. Next, after the second time interval has elapsed from the end of the output of the first alarm signal, delay control circuit 149 causes alarm generation circuit 46 to output the next alarm signal. Delay control circuit 149 may cause alarm generation circuit 46 to output yet another alarm signal.

Figure 6:
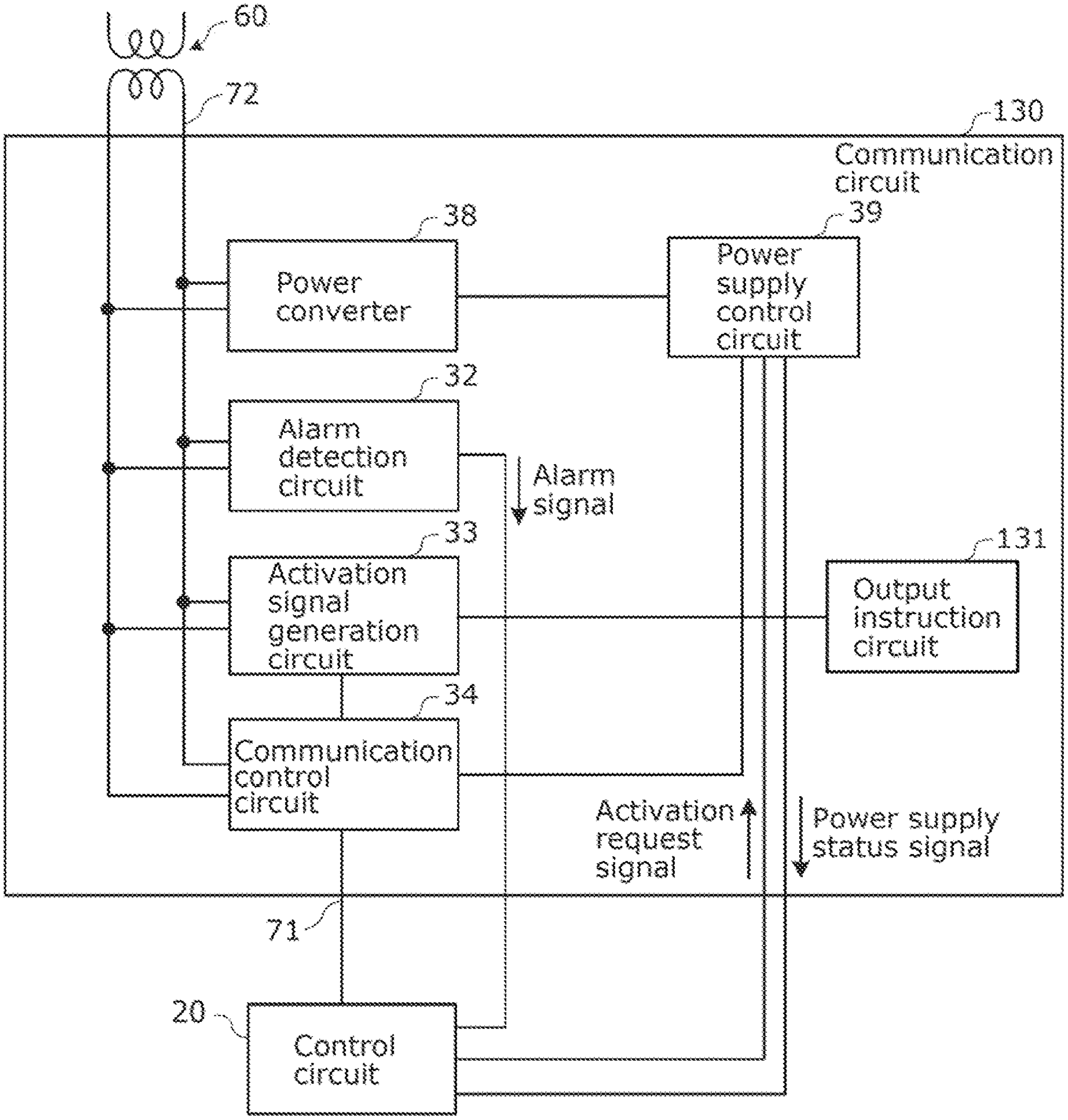
FIG. 6 is a block diagram illustrating the configuration of a communication circuit according to Embodiment 2.

The configuration of communication circuit 130 will be described with reference to FIG. 6. FIG. 6 is a block diagram illustrating the configuration of communication circuit 130 according to the present embodiment. FIG. 6 also illustrates control circuit 20. As illustrated in FIG. 6, in the present embodiment, communication circuit 130 includes first communication path 71, second communication path 72, alarm detection circuit 32, activation signal generation circuit 33, communication control circuit 34, power converter 38, power supply control circuit 39, and output instruction circuit 131.

Output instruction circuit 131 is one example of a second output instruction circuit that causes activation signal generation circuit 33 to output the activation signal a plurality of times at a first time interval. For example, the first time interval is greater than the output period of the alarm signal. Just like output instruction circuit 148, output instruction circuit 131 causes activation signal generation circuit 33 to output the activation signal a plurality of times at a first time interval.

2-2. Operation Methods

Figure 7:
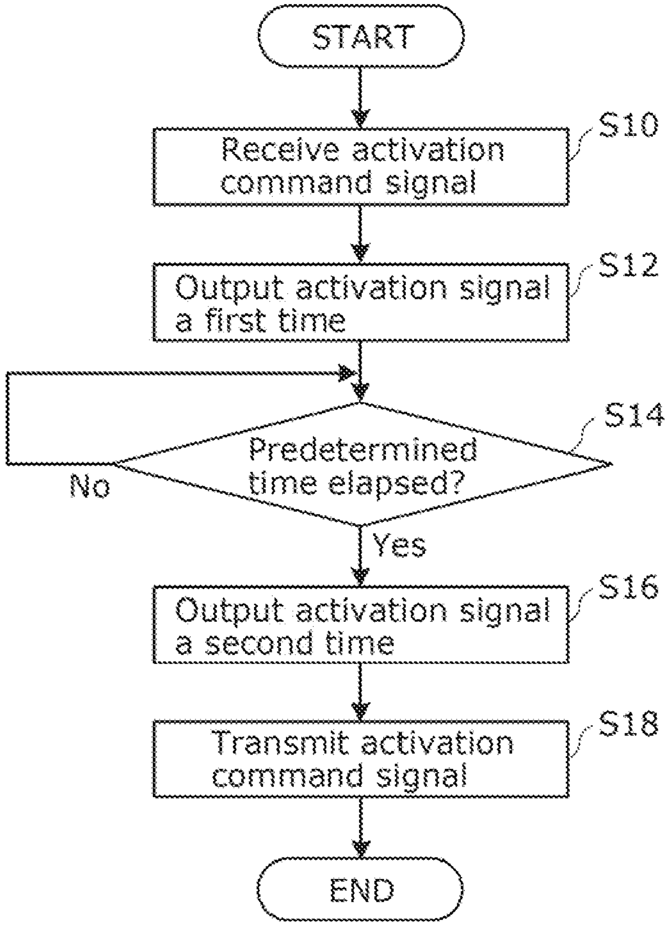
FIG. 7 is a flowchart illustrating the method of outputting an activation signal according to Embodiment 2.
Figure 8:
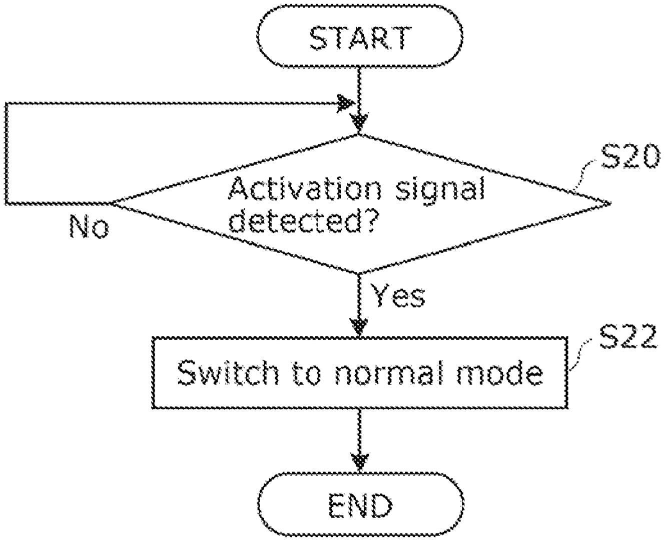
FIG. 8 is a flowchart illustrating the method of detecting an activation signal according to Embodiment 2.
Figure 9:
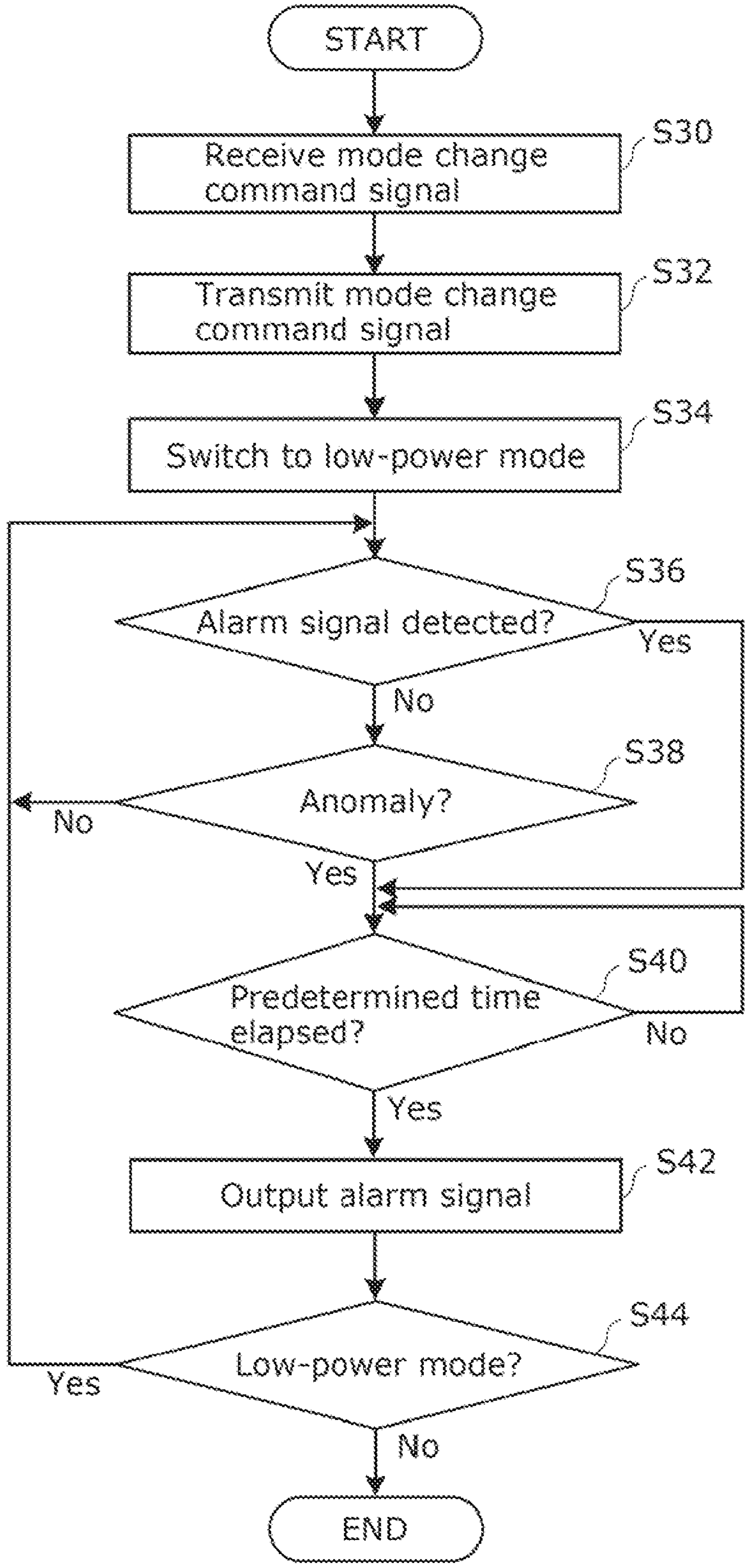
FIG. 9 is a flowchart illustrating the method of outputting an alarm signal according to Embodiment 2.

Operation methods of voltage measurement device 110 according to the present embodiment will be described with reference to FIG. 7 through FIG. 9. FIG. 7 is a flowchart illustrating the method of outputting the activation signal according to the present embodiment. FIG. 8 is a flowchart illustrating the method of detecting the activation signal according to the present embodiment. FIG. 9 is a flowchart illustrating the method of outputting the alarm signal according to the present embodiment. FIG. 7 through FIG. 9 illustrate operation methods in voltage detection circuit 140.

First, the method of outputting the activation signal will be described with reference to FIG. 7.

As illustrated in FIG. 7, when voltage detection circuit 140 outputs an activation signal, first, communication control circuit 44 receives an activation command signal from first communication path 51 (S10). In the present embodiment, voltage detection circuit 140 receives the activation command signal from communication circuit 130.

Next, activation signal generation circuit 43 outputs the activation signal a first time (S12).

Next, output instruction circuit 148 determines whether a predetermined time has elapsed (S14). If the predetermined time has not elapsed (No in S14), output instruction circuit 148 repeats step S14. However, if the predetermined time has elapsed (Yes in S14), output instruction circuit 148 causes activation signal generation circuit 43 to output the activation signal a second time (S16).

Next, communication control circuit 44 transmits the activation command signal to second communication path 52 (S18).

As described above, voltage detection circuit 140 can cause the activation signal to be output a plurality of times at a first time interval. Note that just like voltage detection circuit 140, communication circuit 130 can also cause the activation signal to be output a plurality of times at a first time interval.

Next, the method of detecting the activation signal will be described with reference to FIG. 8.

As illustrated in FIG. 8, first, activation signal detection circuit 45 of voltage detection circuit 140 determines whether an activation signal input from first communication path 51 has been detected (S20). If activation signal detection circuit 45 does not detect an activation signal (No in S20), activation signal detection circuit 45 repeats step S20. If activation signal detection circuit 45 detects an activation signal (Yes in S20), activation signal detection circuit 45 causes mode control circuit 47 to switch the mode of operation to the normal mode (S22).

In this way, voltage detection circuit 140 can detect the activation signal and switch the mode of operation to the normal mode.

Next, the method of outputting the alarm signal will be described with reference to FIG. 9.

As illustrated in FIG. 9, communication control circuit 44 of voltage detection circuit 140 receives a mode change command signal from first communication path 51 (S30).

Next, communication control circuit 44 transmits the mode change command signal to second communication path 52 (S32).

Next, communication control circuit 44 causes mode control circuit 47 to switch the mode of operation to the low-power mode (S34).

Next, alarm detection circuit 42 determines whether an alarm signal has been detected from second communication path 52 (S36). If alarm detection circuit 42 has not detected an alarm signal (No in S36), alarm generation circuit 46 determines whether anomaly information has been input from battery information obtainment circuit 41 (S38). However, if alarm detection circuit 42 has detected an alarm signal (Yes in S36), processing proceeds to step S40.

If alarm generation circuit 46 confirms that no anomaly information has been input (No in S38), processing returns to step S36. However, if alarm generation circuit 46 confirms that anomaly information has been input (Yes in S38), processing proceeds to step S40.

Next, in step S40, voltage detection circuit 140 determines whether a predetermined time has elapsed since the last alarm signal was output. In the present embodiment, as the predetermined time, delay control circuit 149 of voltage detection circuit 140 determines whether the second time interval has elapsed. If the predetermined time has not elapsed (No in S40), step S40 is repeated. However, if the predetermined time has elapsed (Yes in S40), alarm generation circuit 46 outputs an alarm signal to first communication path 51 (S42).

Next, voltage detection circuit 140 determines whether the mode of operation is the low-power mode (S44). If the mode of operation is the low-power mode (Yes in S44), processing returns to step S36. However, if the mode of operation is not the low-power mode (No in S44), the operation for outputting the alarm signal is ended.

As described above, voltage detection circuit 140 can output consecutive alarm signals at a second time interval to avoid collision with the activation signal output for the second time.

2-3. Advantageous Effects

Figure 10:
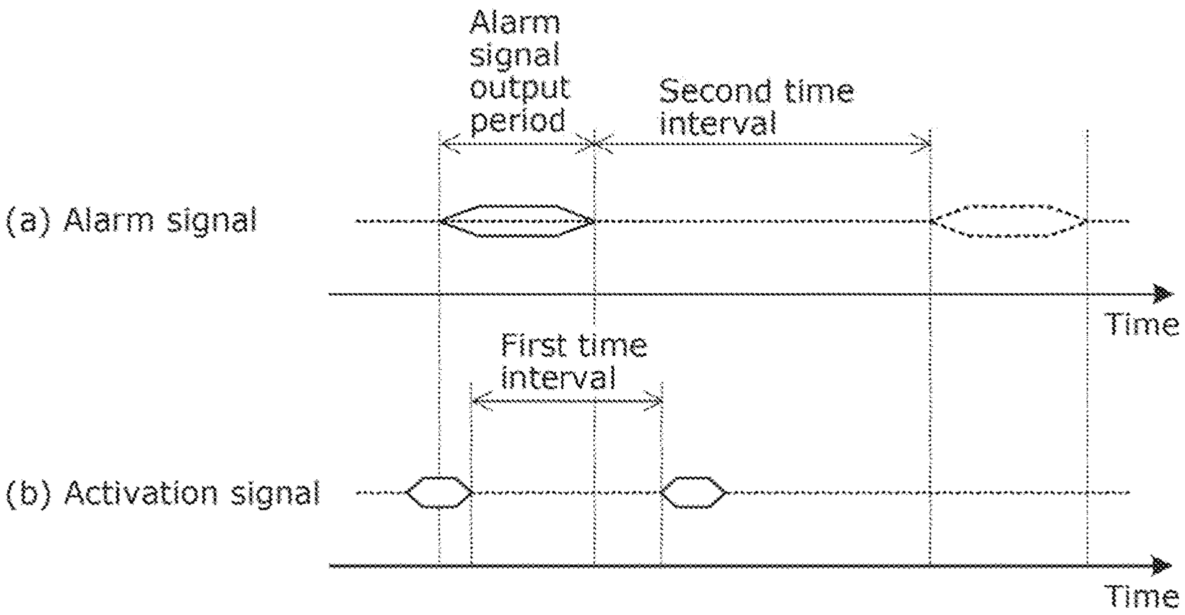
FIG. 10 is a schematic diagram illustrating a first example of the output timing of an alarm signal and an activation signal according to Embodiment 2.
Figure 11:
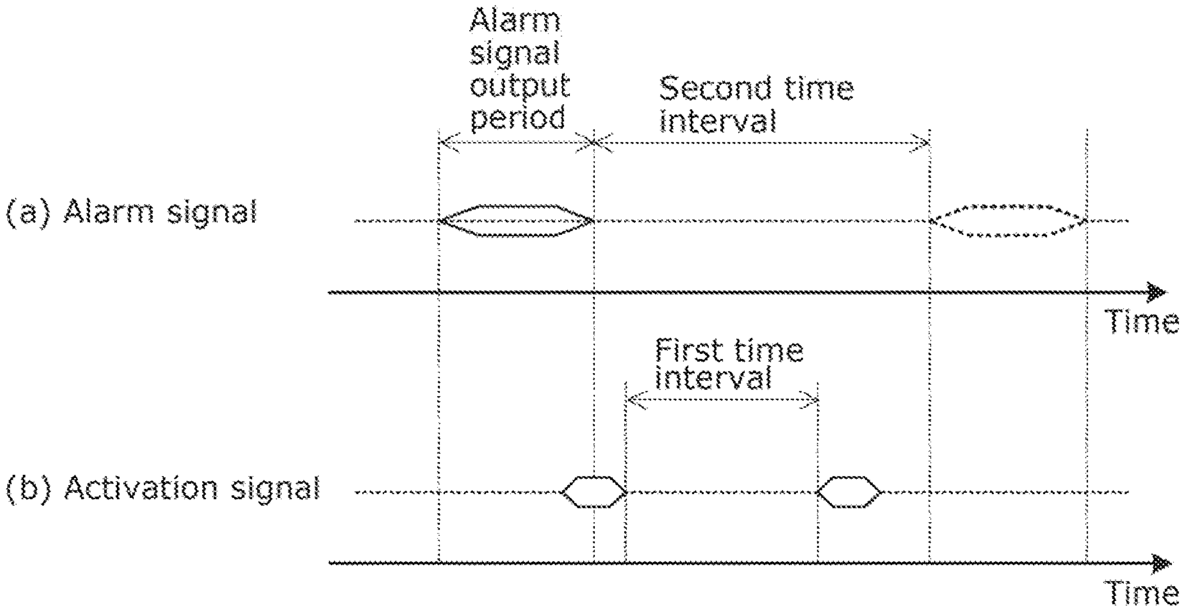
FIG. 11 is a schematic diagram illustrating a second example of the output timing of an alarm signal and an activation signal according to Embodiment 2.

The advantageous effects of voltage measurement device 110 according to the present embodiment will be described with reference to FIG. 10 and FIG. 11. FIG. 10 and FIG. 11 are schematic diagrams illustrating first and second examples, respectively, of the output timing of the alarm signal and the activation signal according to the present embodiment. In FIG. 10 and FIG. 11, graphs (a) illustrate the output timing of the alarm signal, and graphs (b) illustrate the output timing of the activation signal.

FIG. 10 and FIG. 11 illustrate, for example, the output timing of each signal when an alarm signal from voltage detection circuit 140*a* and an activation signal from voltage detection circuit 140 are output between second communication path 52 of voltage detection circuit 140 and first communication path 51 of voltage detection circuit 140*a*.

As illustrated in FIG. 10, if the start of the output of the first alarm signal is during the first output of the activation signal, the alarm signal and the activation signal may collide and neither signal may be detected. However, the activation signal is output a second time after elapse of the first time interval from the end of the first output of the activation signal. Here, since the first time interval is longer than the output period of the alarm signal, collision between the activation signal output for the second time and the first alarm signal output can be avoided with certainty. The activation signal output for the second time is therefore reliably detected by voltage detection circuit 140*a*. This switches the operation mode of voltage detection circuit 140*a* from the low-power mode to the normal mode. If the mode of operation of voltage detection circuit 140*a* is switched to the normal mode before elapse of the second time interval from the end of the first alarm signal, a next alarm signal is not output since the purpose of the alarm signal has been fulfilled by the switch to the normal mode. However, if the mode of operation of voltage detection circuit 140*a* is not switched to normal mode before elapse of the second time interval from the end of the first alarm signal, the next alarm signal is output. This allows for more reliable switching between modes of operation. Since the second time interval is longer than the sum of the first time interval and two output periods of the activation signal, collision between the next alarm signal output and the activation signal output for the second time can be avoided with certainty.

As illustrated in FIG. 11, if the start of the first output of the activation signal is just before the end of the output of the first alarm signal, the alarm signal and the activation signal may collide and neither signal may be detected. However, the activation signal is output a second time after elapse of the first time interval from the end of the first output of the activation signal and the next alarm signal is output after elapse of the second time interval from the end of the first alarm signal. Here, since the second time interval is longer than the sum of the first time interval and two output periods of the activation signal, collision between the next alarm signal and the activation signal output for the second time can be avoided with certainty. The activation signal output for the second time is therefore reliably detected by voltage detection circuit 140*a*. This switches the operation mode of voltage detection circuit 140*a* from the low-power mode to the normal mode. If the mode of operation of voltage detection circuit 140*a* is switched to normal mode before elapse of the second time interval from the end of the first alarm signal, the next alarm signal is not output. However, if the mode of operation of voltage detection circuit 140*a* is not switched to normal mode before elapse of the second time interval from the end of the first alarm signal, the next alarm signal is output. This allows for more reliable switching between modes of operation.

Embodiment 3

The voltage measurement device and the cell stack system according to Embodiment 3 will be described. The voltage measurement device according to the present embodiment differs from voltage measurement device 110 according to Embodiment 2 mainly in regard to the method of avoiding collision between activation signals and alarm signals. Hereinafter, the voltage measurement device and the cell stack system according to the present embodiment will be described, focusing on the differences from voltage measurement device 110 and cell stack system 101 according to Embodiment 2.

3-1. Overall Configuration

Figure 12:
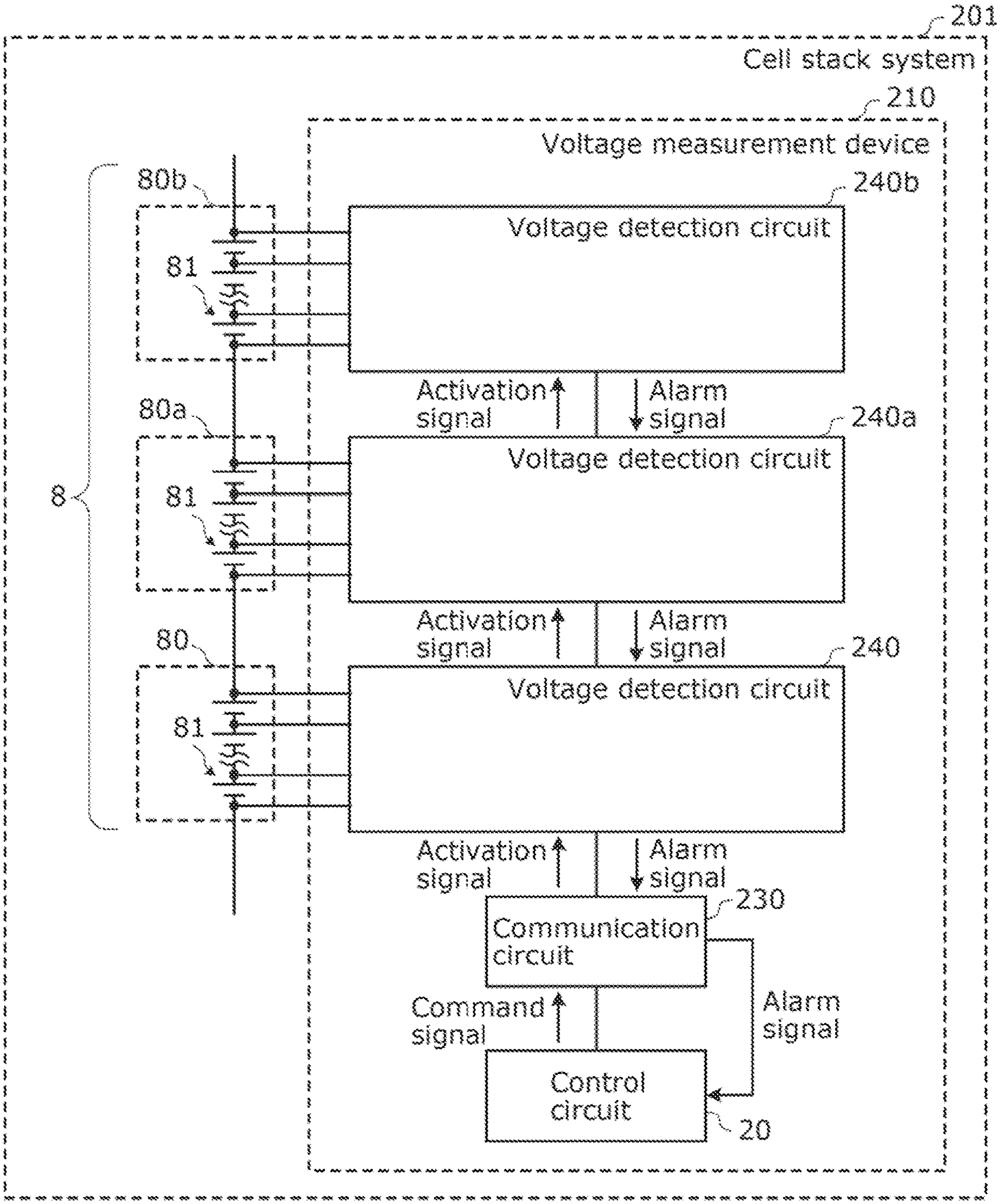
FIG. 12 is a block diagram illustrating the overall configuration of a cell stack system according to Embodiment 3.

The overall configuration of the cell stack system including the voltage measurement device according to the present embodiment will be described with reference to FIG. 12. FIG. 12 is a block diagram illustrating the overall configuration of cell stack system 201 according to the present embodiment. As illustrated in FIG. 12, cell stack system 201 includes voltage measurement device 210 and cell stack 8. Voltage measurement device 210 includes voltage detection circuits 240, 240*a*, and 240*b*, communication circuit 230, and control circuit 20.

Figure 13:
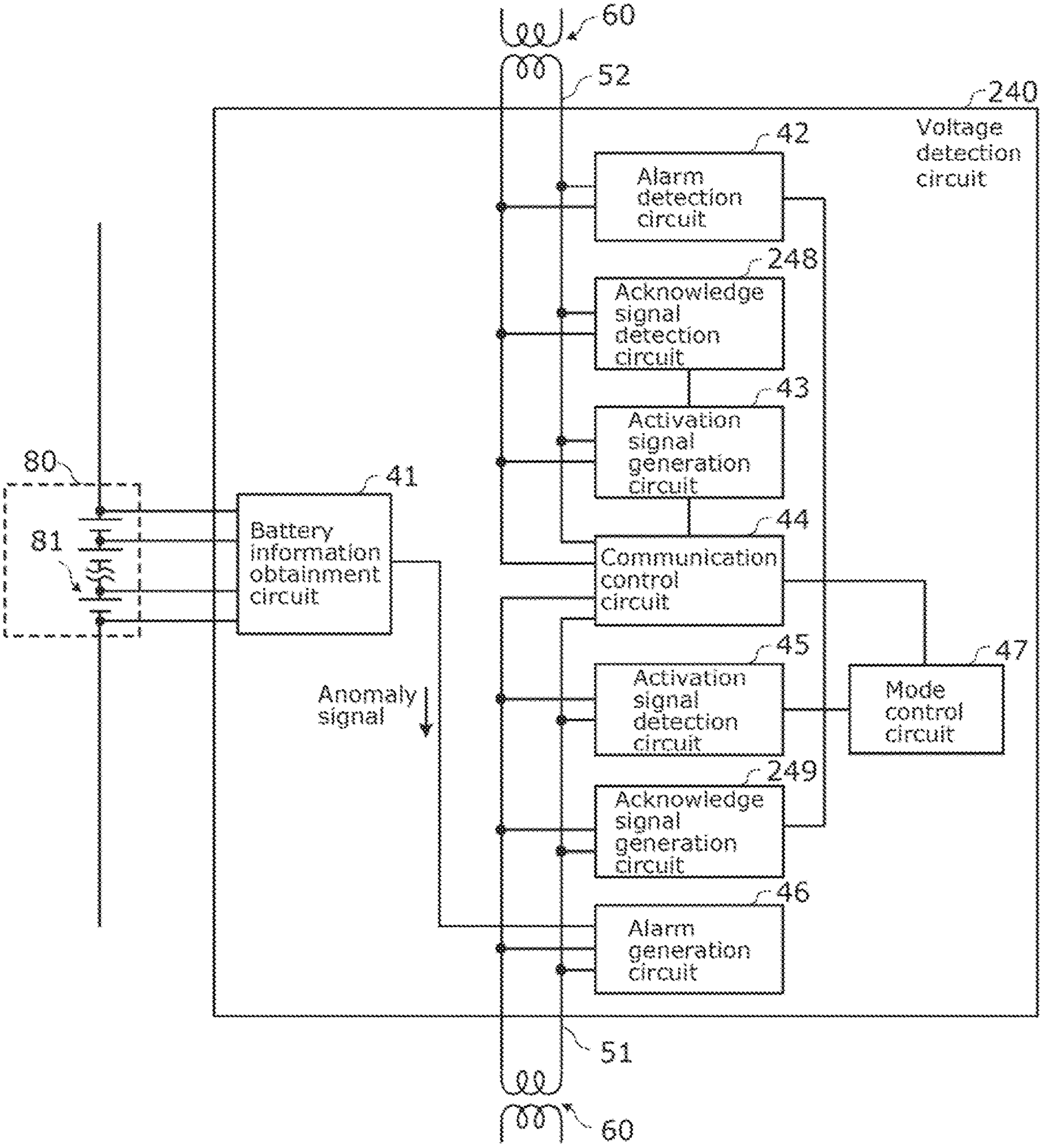
FIG. 13 is a block diagram illustrating the configuration of a voltage detection circuit according to Embodiment 3.

Hereinafter, the configuration of voltage detection circuit 240 will be described with reference to FIG. 13 as a representative of voltage detection circuits 240, 240*a*, and 240*b*. Voltage detection circuits 240*a* and 240*b* have the same configuration as voltage detection circuit 240. FIG. 13 is a block diagram illustrating the configuration of voltage detection circuit 240 according to the present embodiment.

As illustrated in FIG. 13, voltage detection circuit 240 includes battery information obtainment circuit 41, communication control circuit 44, activation signal detection circuit 45, alarm generation circuit 46, mode control circuit 47, alarm detection circuit 42, activation signal generation circuit 43, acknowledge signal detection circuit 248, acknowledge signal generation circuit 249, first communication path 51, and second communication path 52.

Acknowledge signal generation circuit 249 is a circuit that outputs an acknowledge signal when activation signal detection circuit 45 detects an activation signal from first communication path 51. In the present embodiment, acknowledge signal generation circuit 249 outputs an acknowledge signal to first communication path 51.

Acknowledge signal detection circuit 248 is a circuit that detects an acknowledge signal input from second communication path 52. For example, after activation signal generation circuit 43 outputs an activation signal to second communication path 52, if acknowledge signal detection circuit 248 does not detect an acknowledge signal, acknowledge signal detection circuit 248 causes activation signal generation circuit 43 to output the activation signal again.

Figure 14:
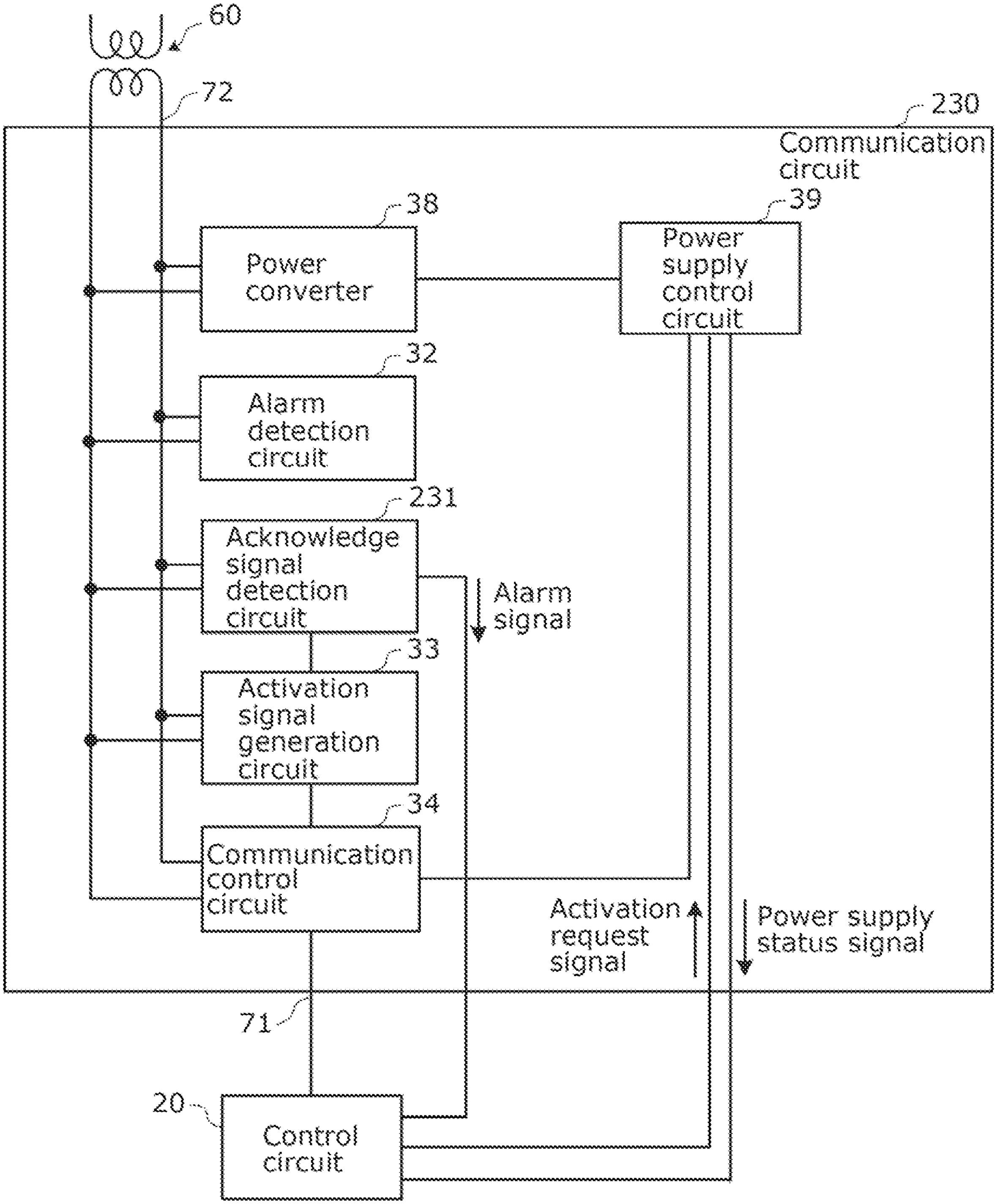
FIG. 14 is a block diagram illustrating the configuration of a communication circuit according to Embodiment 3.

The configuration of communication circuit 230 will be described with reference to FIG. 14. FIG. 14 is a block diagram illustrating the configuration of communication circuit 230 according to the present embodiment. FIG. 14 also illustrates control circuit 20. As illustrated in FIG. 14, in the present embodiment, communication circuit 230 includes first communication path 71, second communication path 72, alarm detection circuit 32, activation signal generation circuit 33, communication control circuit 34, power converter 38, power supply control circuit 39, and acknowledge signal detection circuit 231.

Acknowledge signal detection circuit 231 is a circuit that detects an acknowledge signal input from second communication path 72. For example, after activation signal generation circuit 33 outputs an activation signal to second communication path 72, if acknowledge signal detection circuit 231 does not detect an acknowledge signal, activation signal generation circuit 33 outputs the activation signal again. In the present embodiment, acknowledge signal detection circuit 231 causes activation signal generation circuit 33 to output the activation signal again.

3-2. Operation Methods

Figure 15:
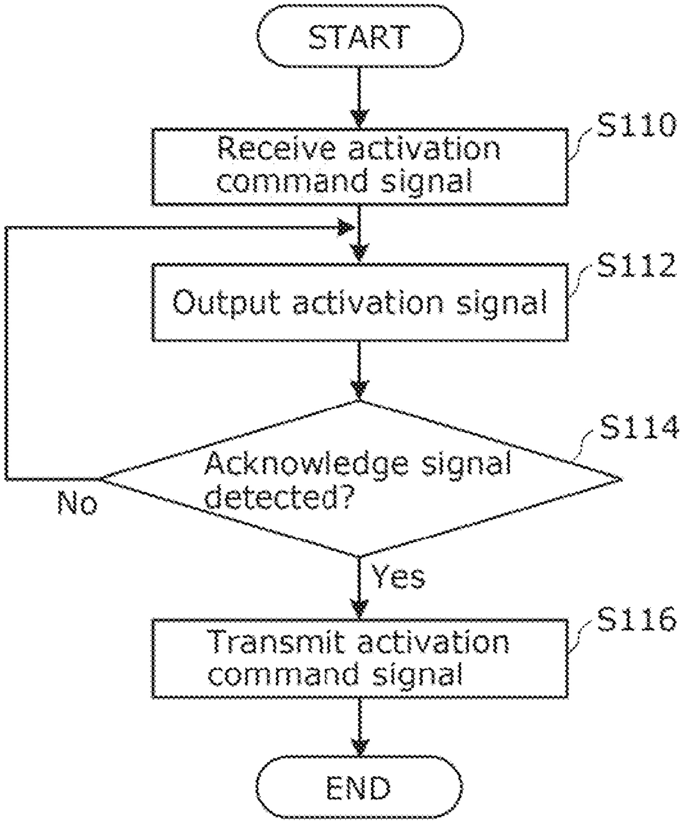
FIG. 15 is a flowchart illustrating the method of outputting an activation signal according to Embodiment 3.
Figure 16:
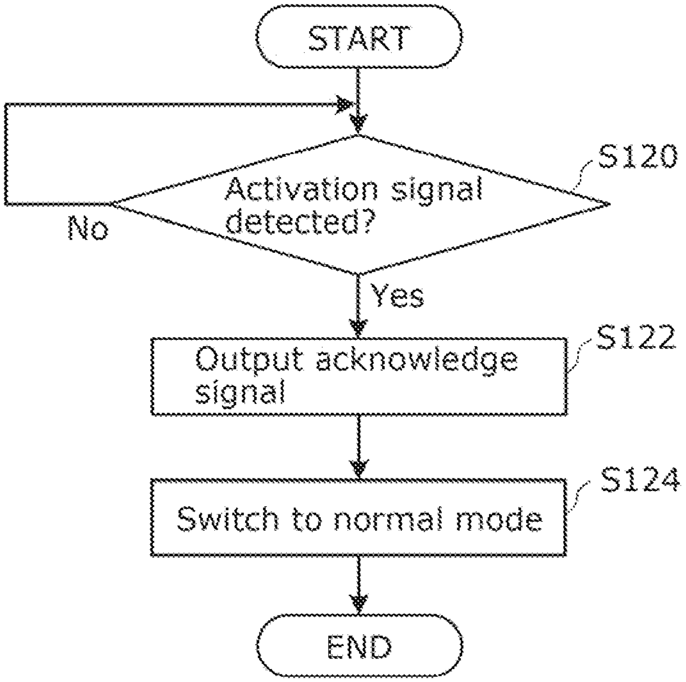
FIG. 16 is a flowchart illustrating the method of detecting an activation signal according to Embodiment 3.
Figure 17:
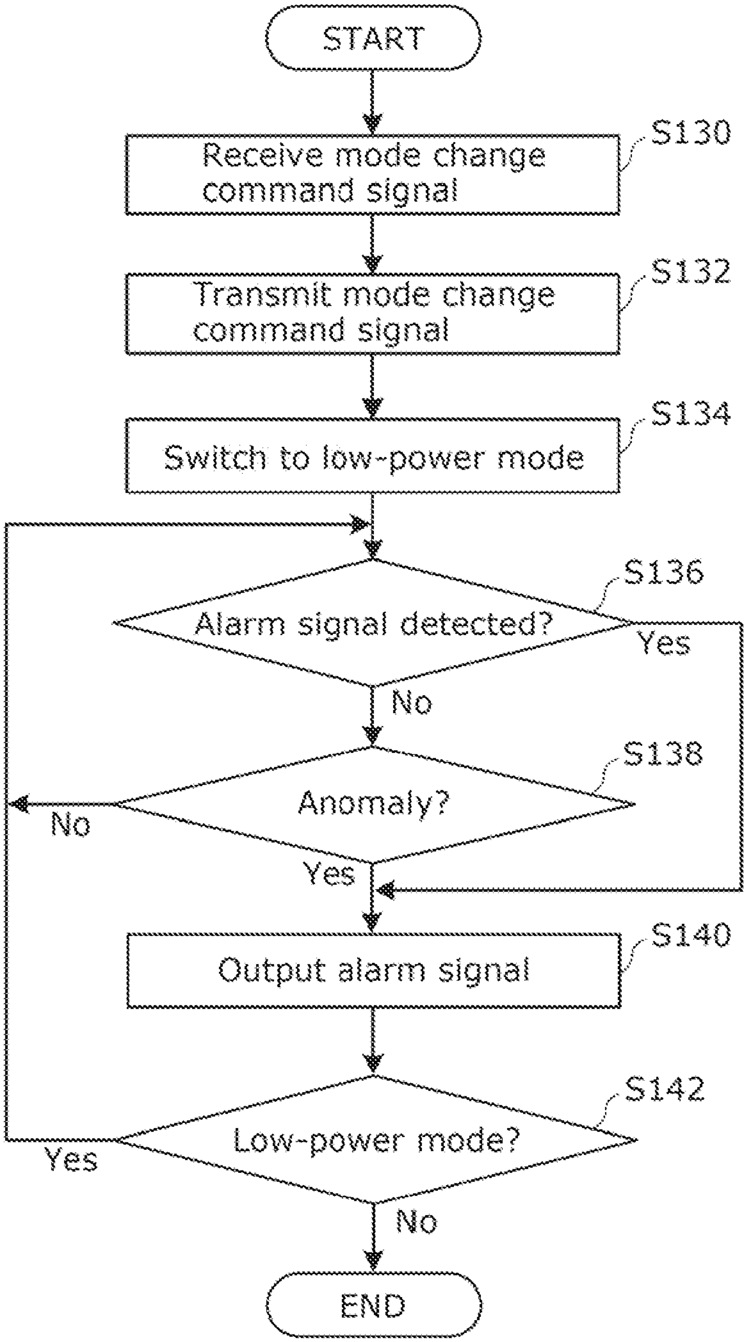
FIG. 17 is a flowchart illustrating the method of outputting an alarm signal according to Embodiment 3.

Operation methods of voltage measurement device 210 according to the present embodiment will be described with reference to FIG. 15 through FIG. 17. FIG. 15 is a flowchart illustrating the method of outputting the activation signal according to the present embodiment. FIG. 16 is a flowchart illustrating the method of detecting the activation signal according to the present embodiment. FIG. 17 is a flowchart illustrating the method of outputting the alarm signal according to the present embodiment. FIG. 15 through FIG. 17 illustrate operation methods in voltage detection circuit 240.

First, the method of outputting the activation signal will be described with reference to FIG. 15.

As illustrated in FIG. 15, when voltage detection circuit 240 outputs an activation signal, first, communication control circuit 44 receives an activation command signal from first communication path 51 (S110). In the present embodiment, voltage detection circuit 240 receives the activation command signal from communication circuit 230.

Next, activation signal generation circuit 43 outputs an activation signal (S112).

Next, acknowledge signal detection circuit 248 determines whether an acknowledge signal has been detected (S114). If acknowledge signal detection circuit 248 has not detected an acknowledge signal (No in S114), acknowledge signal detection circuit 248 causes activation signal generation circuit 43 to output an activation signal again (S112). However, if acknowledge signal detection circuit 248 has detected an acknowledge signal (Yes in S114), communication control circuit 44 transmits an activation command signal to second communication path 52 (S116).

As described above, voltage detection circuit 240 repeatedly outputs an activation signal until it confirms receipt of the activation signal. This allows voltage detection circuit 240*a* to reliably detect the activation signal. Note that just like voltage detection circuit 240, communication circuit 230 also outputs an activation signal.

Next, the method of detecting the activation signal will be described with reference to FIG. 16.

As illustrated in FIG. 16, first, activation signal detection circuit 45 of voltage detection circuit 240 determines whether an activation signal input from first communication path 51 has been detected (S120). If activation signal detection circuit 45 does not detect an activation signal (No in S120), activation signal detection circuit 45 repeats step S120. If activation signal detection circuit 45 detects an activation signal (Yes in S120), activation signal detection circuit 45 causes acknowledge signal generation circuit 249 to output an acknowledge signal to first communication path 51 (S122).

Next, activation signal detection circuit 45 causes mode control circuit 47 to switch the mode of operation to the normal mode (S124).

In this way, if voltage detection circuit 240 detects an activation signal, voltage detection circuit 240 can output an acknowledge signal and switch the mode of operation to the normal mode.

Next, the method of outputting the alarm signal will be described with reference to FIG. 17.

As illustrated in FIG. 17, communication control circuit 44 of voltage detection circuit 240 receives a mode change command signal from first communication path 51 (S130).

Next, communication control circuit 44 transmits the mode change command signal to second communication path 52 (S132).

Next, communication control circuit 44 causes mode control circuit 47 to switch the mode of operation to the low-power mode (S134).

Next, alarm detection circuit 42 determines whether an alarm signal has been detected from second communication path 52 (S136). If alarm detection circuit 42 has not detected an alarm signal (No in S136), alarm generation circuit 46 determines whether anomaly information has been input from battery information obtainment circuit 41 (S138). However, if alarm detection circuit 42 has detected an alarm signal (Yes in S136), processing proceeds to step S140.

If alarm generation circuit 46 confirms that no anomaly information has been input (No in S138), processing returns to step S136. However, if alarm generation circuit 46 confirms that anomaly information has been input (Yes in S138), processing proceeds to step S140.

Next, in step S140, alarm generation circuit 46 outputs an alarm signal to first communication path 51 (S140).

Next, voltage detection circuit 240 determines whether the mode of operation is the low-power mode (S142). If the mode of operation is the low-power mode (Yes in S142), processing returns to step S136. However, if the mode of operation is not the low-power mode (No in S142), the operation for outputting the alarm signal is ended.

As described above, voltage detection circuit 240 can repeatedly output an alarm signal until the mode of operation is switched from the low-power mode to the normal mode.

3-3. Advantageous Effects

Figure 18:
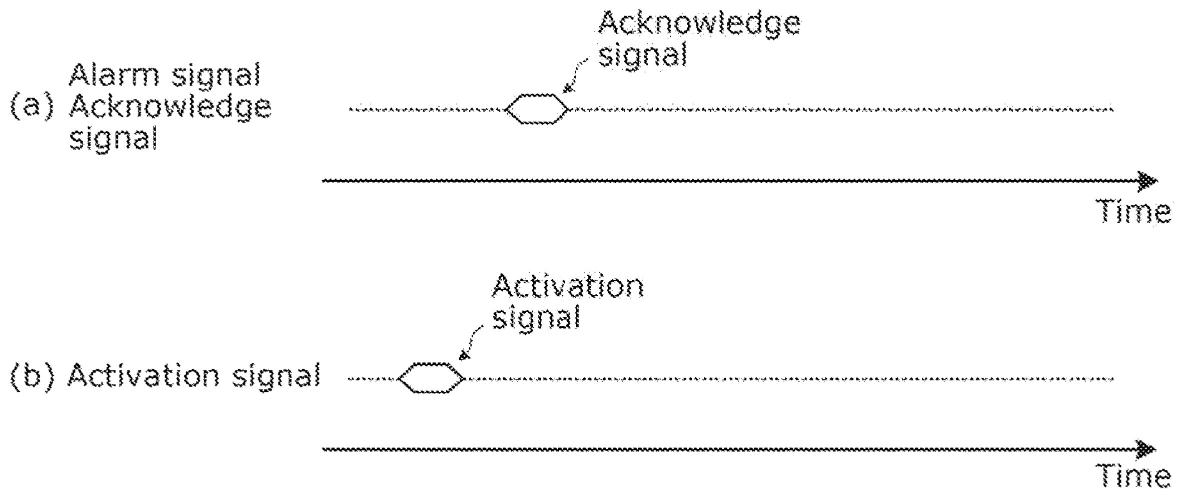
FIG. 18 is a schematic diagram illustrating a first example of the output timing of an alarm signal, an acknowledge signal, and an activation signal according to Embodiment 3.
Figure 19:
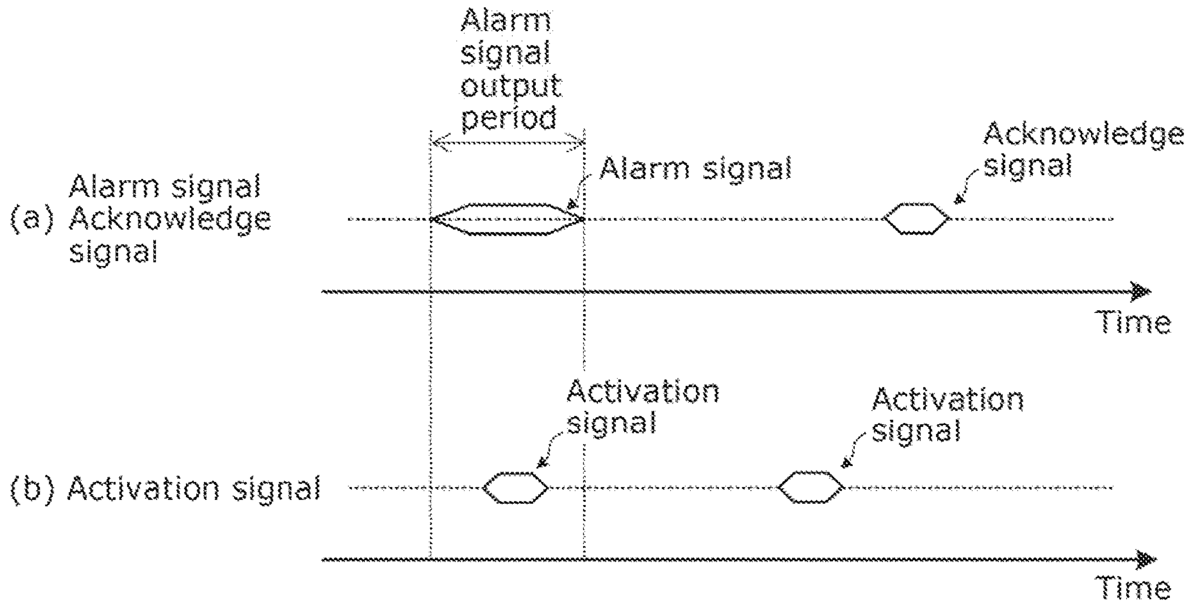
FIG. 19 is a schematic diagram illustrating a second example of the output timing of an alarm signal, an acknowledge signal, and an activation signal according to Embodiment 3.

The advantageous effects of voltage measurement device 210 according to the present embodiment will be described with reference to FIG. 18 and FIG. 19. FIG. 18 and FIG. 19 are schematic diagrams illustrating first and second examples, respectively, of the output timing of the alarm signal, the acknowledge signal, and the activation signal according to the present embodiment. In FIG. 18 and FIG. 19, graphs (a) illustrate the output timing of the alarm signal and the acknowledge signal, and graphs (b) illustrate the output timing of the activation signal.

FIG. 18 and FIG. 19 illustrate, for example, the output timing of each signal when an alarm signal and an acknowledge signal from voltage detection circuit 240*a* and an activation signal from voltage detection circuit 240 are output between second communication path 52 of voltage detection circuit 240 and first communication path 51 of voltage detection circuit 240*a*.

As illustrated in FIG. 18, if an activation signal is output without colliding with an alarm signal, activation signal detection circuit 45 of voltage detection circuit 240*a* detects the activation signal and acknowledge signal generation circuit 249 outputs an acknowledge signal.

This acknowledge signal is detected by acknowledge signal detection circuit 248 of voltage detection circuit 240. This allows voltage detection circuit 240 to confirm that voltage detection circuit 240*a* has detected the activation signal, so it does not output the activation signal a second time.

If voltage detection circuit 240*a* detects the activation signal and the mode of operation is switched to the normal mode, no alarm signal is output since the purpose of the alarm signal has been fulfilled by the switch to the normal mode.

As illustrated in FIG. 19, if the start of the first output of the activation signal is during the first output of the alarm signal, the alarm signal and the activation signal may collide and neither signal may be detected. In this case, since no acknowledge signal is output from voltage detection circuit 240*a*, activation signal generation circuit 43 of voltage detection circuit 240 outputs the activation signal a second time. In the example illustrated in FIG. 19, since the activation signal output for the second time does not collide with the alarm signal, activation signal detection circuit 45 of voltage detection circuit 240*a* detects the activation signal and acknowledge signal generation circuit 249 outputs an acknowledge signal.

This acknowledge signal is detected by acknowledge signal detection circuit 248 of voltage detection circuit 240. This allows voltage detection circuit 240 to confirm that voltage detection circuit 240*a* has detected the activation signal, so it does not output the activation signal a third time.

In this way, activation signal generation circuit 43 of voltage detection circuit 240 according to the present embodiment repeatedly outputs the activation signal until an acknowledge signal is detected by acknowledge signal detection circuit 248. Accordingly, voltage detection circuit 240*a* can reliably detect the activation signal.

Embodiment 4

The voltage measurement device and the cell stack system according to Embodiment 4 will be described. The voltage measurement device according to the present embodiment differs from voltage measurement device 10 according to Embodiment 1 mainly in regard to the connection of the communication circuit and the plurality of voltage detection circuits. Hereinafter, the voltage measurement device and the cell stack system according to the present embodiment will be described, focusing on the differences from voltage measurement device 10 and cell stack system 1 according to Embodiment 1.

4-1. Overall Configuration

Figure 20:
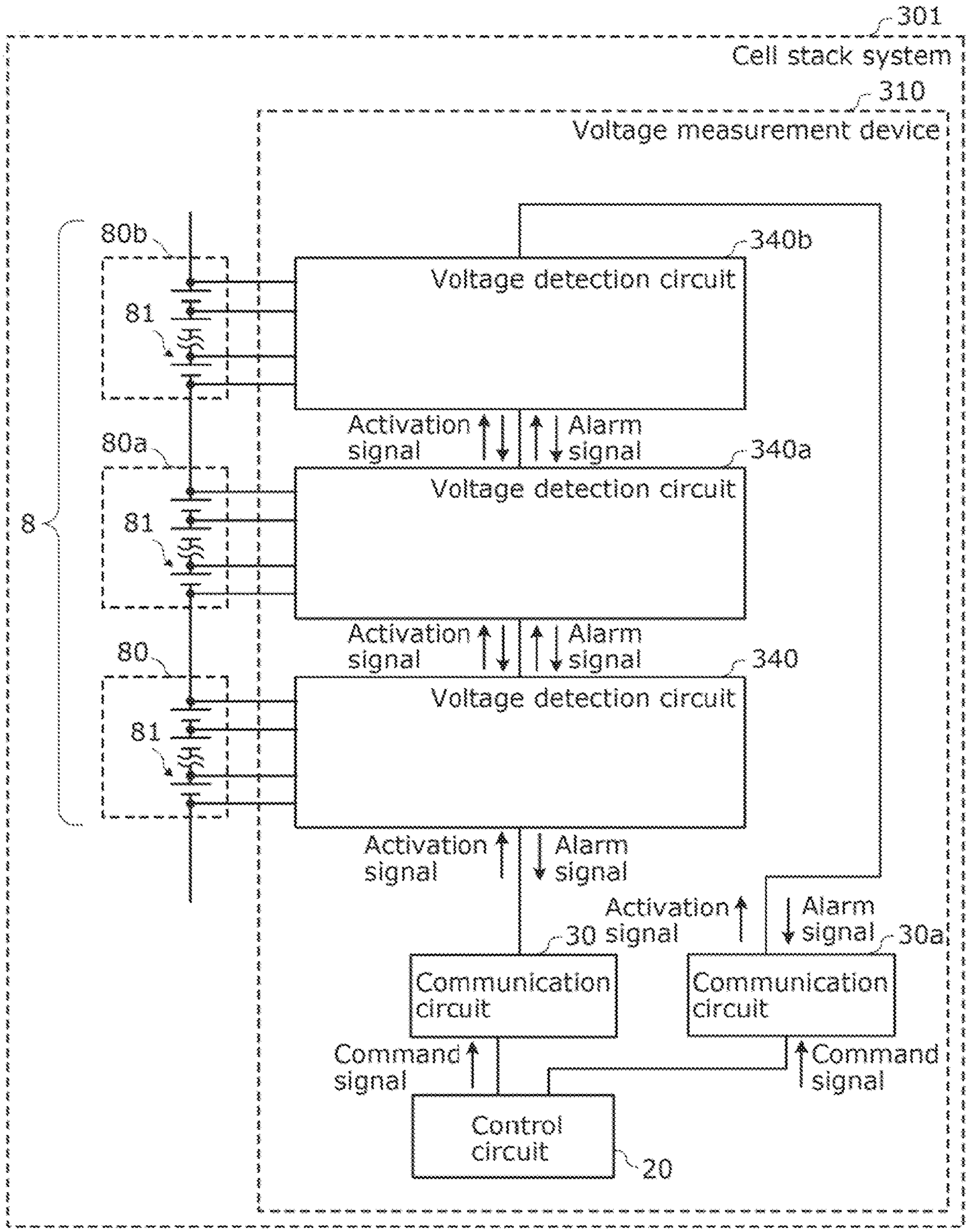
FIG. 20 is a block diagram illustrating the overall configuration of a cell stack system according to Embodiment 4.

The overall configuration of the cell stack system including the voltage measurement device according to the present embodiment will be described with reference to FIG. 20. FIG. 20 is a block diagram illustrating the overall configuration of cell stack system 301 according to the present embodiment. As illustrated in FIG. 20, cell stack system 301 includes voltage measurement device 310 and cell stack 8. Voltage measurement device 310 includes voltage detection circuits 340, 340*a*, and 340*b*, communication circuits 30 and 30*a*, and control circuit 20.

In the present embodiment, communication circuits 30 and 30*a* are respectively connected to voltage detection circuits 340 and 340*b*, which are located at both ends of the daisy-chained voltage detection circuits 340, 340*a*, and 340*b*.

Communication circuit 30*a* has the same configuration as communication circuit 30. Note that communication circuit 30 and communication circuit 30*a* may be integrated into a single communication circuit.

Figure 21:
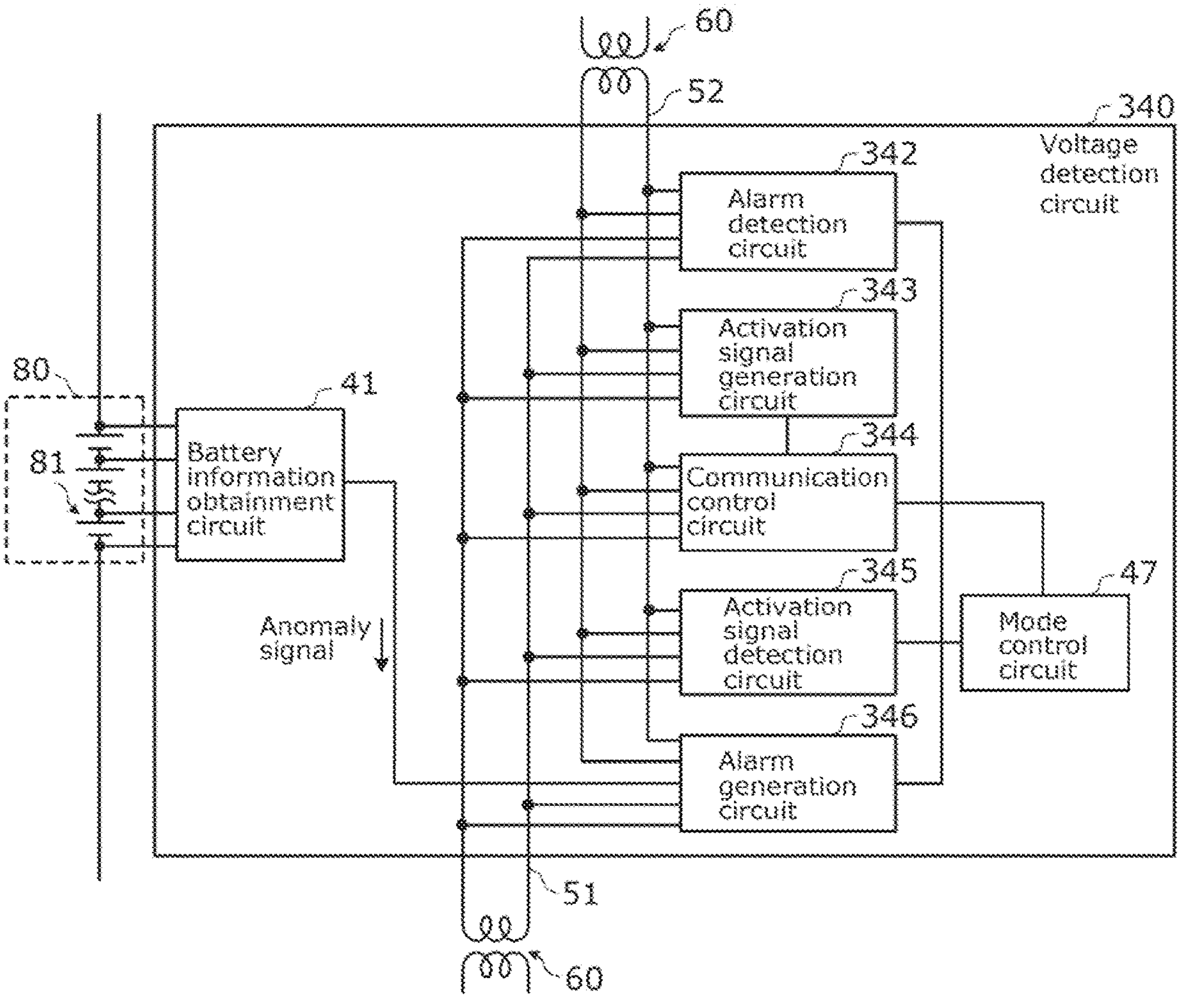
FIG. 21 is a block diagram illustrating the configuration of a voltage detection circuit according to Embodiment 4.

Hereinafter, the configuration of voltage detection circuit 340 will be described with reference to FIG. 21 as a representative of voltage detection circuits 340, 340*a*, and 340*b*. Voltage detection circuits 340*a* and 340*b* have the same configuration as voltage detection circuit 340. FIG. 21 is a block diagram illustrating the configuration of voltage detection circuit 340 according to the present embodiment.

As illustrated in FIG. 21, voltage detection circuit 340 includes battery information obtainment circuit 41, communication control circuit 344, activation signal detection circuit 345, alarm generation circuit 346, mode control circuit 47, alarm detection circuit 342, activation signal generation circuit 343, first communication path 51, and second communication path 52.

Alarm detection circuit 342 detects alarm signals input from first communication path 51 and second communication path 52. When alarm detection circuit 342 detects an alarm signal, it outputs an alarm detection signal to alarm generation circuit 346.

In the low-power mode, alarm generation circuit 346 is a circuit that generates and outputs an alarm signal indicating an anomaly in battery cell 81 to at least one of first communication path 51 or second communication path 52. In the low-power mode, alarm generation circuit 346 outputs an alarm signal to at least one of first communication path 51 or second communication path 52 when voltage detection circuit 340 detects an anomaly in a plurality of battery cells 81 or when alarm detection circuit 342 detects an alarm signal.

In the present embodiment, alarm generation circuit 346 outputs an alarm signal to second communication path 52 when alarm detection circuit 342 detects an alarm signal from first communication path 51, and outputs an alarm signal to first communication path 51 when alarm detection circuit 342 detects an alarm signal from second communication path 52. More specifically, when alarm detection circuit 342 detects an alarm signal, it outputs an alarm detection signal to alarm generation circuit 346. Alarm generation circuit 346 outputs an alarm signal when an alarm detection signal is input to alarm generation circuit 346.

Communication control circuit 344 transmits and receives a command signal to and from first communication path 51 and second communication path 52. In the present embodiment, a command signal is transmitted and received from first communication path 51 and second communication path 52. When communication control circuit 344 receives an activation command signal from second communication path 52, activation signal generation circuit 343 outputs an activation signal to first communication path 51.

Activation signal generation circuit 343 generates and outputs an activation signal to first communication path 51 or second communication path 52. When communication control circuit 344 receives an activation command signal from first communication path 51, activation signal generation circuit 343 outputs an activation signal to second communication path 52. When communication control circuit 344 receives an activation command signal from second communication path 52, activation signal generation circuit 343 outputs an activation signal to first communication path 51.

Activation signal detection circuit 345 is a circuit that detects activation signals input from first communication path 51 and second communication path 52. When activation signal detection circuit 345 detects an activation signal input from first communication path 51 or second communication path 52, activation signal detection circuit 345 outputs an activation request signal to mode control circuit 47 to cause mode control circuit 47 to switch the mode of operation of voltage detection circuit 340 to the normal mode. When activation signal detection circuit 345 detects an activation signal input from first communication path 51, activation signal detection circuit 345 causes activation signal generation circuit 343 to output an activation signal to second communication path 52. When activation signal detection circuit 345 detects an activation signal input from second communication path 52, activation signal detection circuit 345 causes activation signal generation circuit 343 to output an activation signal to first communication path 51.

In the present embodiment, second communication path 52 of voltage detection circuit 340*b* is connected to second communication path 72 of communication circuit 30*a*. First communication path 71 of communication circuit 30*a* is connected to control circuit 20.

4-2. Operation Methods

The operation of voltage measurement device 310 according to the present embodiment differs from the operation of voltage measurement device 10 according to Embodiment 1 in that each signal in communication circuit 30 and 30*a* and voltage detection circuits 340, 340*a*, and 340*b* also flows in the opposite direction of voltage measurement device 10 according to Embodiment 1.

With voltage measurement device 310 configured in such a manner, for example, since the daisy communication path is configured in a circular fashion, even if part of the daisy communication path is interrupted, signals can be transmitted and received using the uninterrupted portion. This makes it possible to increase the reliability of voltage measurement device 310.

Variations, Etc.

Although the present disclosure has been described based on the above embodiments, the present disclosure is not limited to the above embodiments.

For example, in each of the above embodiments, the cell stack system includes a communication circuit and a control circuit, but these circuits are not necessarily elements.

In each of the above embodiments, the voltage measurement device includes a plurality of voltage detection circuits, but the voltage measurement device may include a single voltage detection circuit. Stated differently, the voltage measurement device may include one or more voltage detection circuits.

The voltage detection circuit according to each of the above embodiments may include a timer, and in the low-power mode, may periodically measure the voltage of battery cell 81 using the timer and output the measurement result as an alarm signal.

The voltage detection circuit may output, as the alarm signal, a plurality of measurement results, such as the measured voltage value being above an upper limit (upper limit violation), being below a lower limit (lower limit violation), or being within the normal range, by changing the form of the alarm signal. This allows control circuit 20 to efficiently process the measurement results. Outputting that the measured voltage is normal as an alarm signal makes it known that the voltage of battery cell 81 is periodically measured.

The voltage detection circuit may output information such as a power supply voltage anomaly, a temperature anomaly, and a clock anomaly as an alarm signal.

Although the activation signal generation circuit of the voltage detection circuit is exemplified as transmitting the activation signal after the communication control circuit receives the activation command signal, the activation signal generation circuit may output the activation signal after the activation signal detection circuit detects the activation signal.

The cell stack system according to each of the above embodiments may be housed in, for example, a single housing, and, alternatively, may be separated into a plurality of housings.

Some or all of the elements included in the voltage measurement device and the cell stack system according to the above embodiments may be configured in the form of a single system Large Scale Integration (LSI) chip. A system LSI chip is a super multifunctional LSI chip manufactured by integrating a plurality of elements on a single chip. More specifically, a system LSI chip is, for example, a computer system including a microprocessor, ROM, RAM, etc. The RAM stores a computer program. The functions of the system LSI chip are realized by the microprocessor operating according to the computer program.

Some or all of the elements of the voltage measurement device and the cell stack system according to each of the above embodiments may be configured in the form of a detachable IC card or a stand-alone module. The IC card or module may be a computer system including a microprocessor, ROM, RAM, etc. The IC card or module may include the above-described super multifunctional LSI circuit. The functions of the IC card or module are realized by the microprocessor operating according to a computer program. The IC card or module may be tamperproof.

The present disclosure may be realized as a computer system including a microprocessor and memory, the memory may store the above-described computer program, and the microprocessor may operate according to the computer program.

Various modifications of the above embodiments that may be conceived by those skilled in the art, as well as embodiments resulting from arbitrary combinations of elements and functions from different embodiments that do not depart from the essence of the present disclosure are included the present disclosure.

For example, the configuration of each voltage measurement device according to Embodiment 2 or Embodiment 3 may be combined with voltage measurement device 310 according to Embodiment 4.

INDUSTRIAL APPLICABILITY

The voltage measurement device and the cell stack system according to the present disclosure can be used, for example, as a cell stack system or the like for an in-vehicle cell stack system.

The invention claimed is:

1. A voltage measurement device that measures a voltage of at least one battery cell among a plurality of battery cells connected in series, the voltage measurement device comprising:

one or more voltage detection circuits, wherein each of the one or more voltage detection circuits includes:

a first communication path;

a second communication path different from the first communication path;

a mode control circuit that switches a mode of operation of the voltage detection circuit between a normal mode and a low-power mode that consumes less power than the normal mode;

a first communication control circuit that transmits and receives a command signal to and from the first communication path;

an activation signal detection circuit that detects a first activation signal input from the first communication path or the second communication path;

a first activation signal generation circuit that generates a second activation signal;

a first alarm detection circuit that detects a first alarm signal input from the first communication path or the second communication path; and an alarm generation circuit that, in the low-power mode, generates a second alarm signal indicating an anomaly in the plurality of battery cells, in the low-power mode, when the activation signal detection circuit detects the first activation signal input from the first communication path, the mode control circuit switches the mode of operation to the normal mode, and when the first alarm detection circuit detects the first alarm signal input from the second communication path, the alarm generation circuit outputs the second alarm signal to the first communication path.

2. The voltage measurement device according to claim 1, wherein in each of the one or more voltage detection circuits:

the first alarm detection circuit detects the first alarm signal input from the first communication path; and in the low-power mode, when the voltage detection circuit detects an anomaly in the plurality of battery cells or the first alarm detection circuit detects the first alarm signal, the alarm generation circuit outputs the second alarm signal to the second communication path.

3. The voltage measurement device according to claim 1, wherein in each of the one or more voltage detection circuits:

when the first communication control circuit receives an activation command signal from the first communication path, the first activation signal generation circuit outputs the second activation signal to the second communication path.

4. The voltage measurement device according to claim 3, wherein in each of the one or more voltage detection circuits:

when the first communication control circuit receives the activation command signal from the second communication path, the first activation signal generation circuit outputs the second activation signal to the first communication path; and when the activation signal detection circuit detects the first activation signal input from the second communication path, the mode control circuit switches the mode of operation of the voltage detection circuit to the normal mode.

5. The voltage measurement device according to claim 1, wherein in each of the one or more voltage detection circuits:

when the activation signal detection circuit detects the first activation signal input from the first communication path, the first activation signal generation circuit outputs the second activation signal to the second communication path.

6. The voltage measurement device according to claim 5, wherein in each of the one or more voltage detection circuits:

when the activation signal detection circuit detects the first activation signal input from the second communication path, the first activation signal generation circuit outputs the second activation signal to the first communication path, and the mode control circuit switches the mode of operation of the voltage detection circuit to the normal mode.

7. The voltage measurement device according to claim 1, wherein the one or more voltage detection circuits comprise a plurality of voltage detection circuits that are daisy-chained, and the second communication path of one of two voltage detection circuits that are adjacently connected among the plurality of voltage detection circuits is connected to the first communication path of an other of the two voltage detection circuits.

8. The voltage measurement device according to claim 7, wherein the second communication path of one of the two voltage detection circuits that are adjacently connected among the plurality of voltage detection circuits is connected to the first communication path of the other of the two voltage detection circuits via an isolation element.

9. The voltage measurement device according to claim 7, further comprising:

a communication circuit that is connected to the first communication path of a first voltage detection circuit located at one end among the plurality of voltage detection circuits that are daisy-chained, and communicates with the plurality of voltage detection circuits; and a control circuit that is connected to the communication circuit and controls the plurality of voltage detection circuits.

10. The voltage measurement device according to claim 9, wherein the communication circuit includes:

a second alarm detection circuit that detects the first alarm signal;

a second activation signal generation circuit that generates a third activation signal; and a second communication control circuit that transmits and receives the command signal, when the second alarm detection circuit detects the first alarm signal, the second alarm detection circuit notifies the control circuit of the detection of the alarm signal, and the second activation signal generation circuit outputs the third activation signal to the first communication path of the first voltage detection circuit.

11. The voltage measurement device according to claim 10, wherein the communication circuit further includes a second output instruction circuit that causes the second activation signal generation circuit to output the third activation signal a plurality of times at a first time interval.

12. The voltage measurement device according to claim 7, wherein each of the one or more voltage detection circuits further includes a first output instruction circuit that causes the first activation signal generation circuit to output the second activation signal a plurality of times at a first time interval.

13. The voltage measurement device according to claim 12, wherein the first time interval is longer than an output period of the second alarm signal.

14. The voltage measurement device according to claim 12, wherein each of the one or more voltage detection circuits further includes a delay control circuit that causes the alarm generation circuit to output two consecutive second alarm signals, each of which is the second alarm signal, at a second time interval.

15. The voltage measurement device according to claim 14, wherein the second time interval is longer than a sum of the first time interval and two output periods of the second activation signal.

16. The voltage measurement device according to claim 7, wherein each of the one or more voltage detection circuits further includes:

an acknowledge signal generation circuit that outputs an acknowledge signal when the activation signal detection circuit detects the first activation signal; and an acknowledge signal detection circuit that detects the acknowledge signal, and when the acknowledge signal detection circuit does not detect the acknowledge signal after the first activation signal generation circuit outputs the second activation signal, the first activation signal generation circuit outputs the second activation signal again.

17. The voltage measurement device according to claim 1, further comprising:

a communication circuit that is connected to the first communication path of a first voltage detection circuit which is one voltage detection circuit among the one or more voltage detection circuits, and communicates with the one or more voltage detection circuits; and a control circuit that is connected to the communication circuit and controls the one or more voltage detection circuits.

18. A cell stack system comprising:

the voltage measurement device according to claim 1; and a cell stack including the plurality of battery cells.

* * * * *